US009978313B2

(12) United States Patent
Jeong et al.

(10) Patent No.: US 9,978,313 B2
(45) Date of Patent: May 22, 2018

(54) ORGANIC LIGHT EMITTING DIODE DISPLAY, DRIVING METHOD THEREOF, AND MANUFACTURING METHOD THEREOF

(71) Applicant: SAMSUNG DISPLAY CO., LTD., Yongin-si, Gyeonggi-do (KR)

(72) Inventors: Cheol Yun Jeong, Yongin-si (KR); Jong Hyun Choi, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days. days.

(21) Appl. No.: 15/205,892

(22) Filed: Jul. 8, 2016

(65) Prior Publication Data

US 2016/0321997 A1    Nov. 3, 2016

Related U.S. Application Data

(62) Division of application No. 14/542,900, filed on Nov. 17, 2014, now Pat. No. 9,390,655.

(30) Foreign Application Priority Data

Jul. 10, 2014    (KR) ........................ 10-2014-0086975

(51) Int. Cl.
*H01L 51/56* (2006.01)
*G09G 3/3258* (2016.01)
(Continued)

(52) U.S. Cl.
CPC ......... *G09G 3/3258* (2013.01); *G09G 3/3233* (2013.01); *G09G 3/3275* (2013.01);
(Continued)

(58) Field of Classification Search
CPC .. G09G 3/3258; G09G 3/3233; G09G 3/3275; H01L 27/3262; H01L 51/56; H01L 27/3265; H01L 27/3276
See application file for complete search history.

(56) References Cited

U.S. PATENT DOCUMENTS

2011/0128211 A1    6/2011  Ono
2011/0233553 A1*   9/2011  Sakakura ............ H01L 27/1214
                                                              257/59
(Continued)

FOREIGN PATENT DOCUMENTS

JP    2003-208124 A    7/2003
JP    2003-216103 A    7/2003
(Continued)

*Primary Examiner* — Long Pham
(74) *Attorney, Agent, or Firm* — Lee & Morse, P.C.

(57) ABSTRACT

An organic light emitting diode display includes a semiconductor pattern which includes a plurality of channel regions. A first gate insulating layer is on the semiconductor pattern, a first gate conductive layer is on the first gate insulating layer, a second gate insulating layer is on the first gate conductive layer, and a second gate conductive layer is on the second gate insulating layer. The channel regions include a first channel region that overlaps the first gate conductive layer and a second channel region that does not overlap the first gate conductive layer. The first channel region and the second channel region have different doping concentrations.

4 Claims, 44 Drawing Sheets

(51) Int. Cl.
*H01L 27/32* (2006.01)
*G09G 3/3233* (2016.01)
*G09G 3/3275* (2016.01)
*H01L 27/12* (2006.01)
*H01L 29/786* (2006.01)

(52) U.S. Cl.
CPC ...... *H01L 27/3262* (2013.01); *H01L 27/3265* (2013.01); *H01L 27/3276* (2013.01); *H01L 51/56* (2013.01); *G09G 2300/0426* (2013.01); *G09G 2300/0814* (2013.01); *G09G 2300/0819* (2013.01); *G09G 2320/0233* (2013.01); *G09G 2320/0238* (2013.01); *G09G 2320/045* (2013.01); *G09G 2320/0626* (2013.01); *H01L 27/124* (2013.01); *H01L 27/1255* (2013.01); *H01L 27/1262* (2013.01); *H01L 29/78696* (2013.01); *H01L 2227/323* (2013.01)

(56) References Cited

U.S. PATENT DOCUMENTS

2015/0102355 A1\* 4/2015 Yang ................... H01L 27/124
257/72
2015/0269989 A1\* 9/2015 Tailliet ................... G11C 11/41
365/185.07

FOREIGN PATENT DOCUMENTS

| JP | 2003-255899 A | 9/2003 |
| JP | 2009-123877 A | 6/2009 |
| JP | 2009-151152 A | 7/2009 |
| JP | 4081794 B2 | 8/2011 |
| KR | 10-2003-0057441 A | 7/2003 |
| KR | 10-2005-0024594 A | 3/2005 |
| KR | 10-0712211 B1 | 4/2007 |
| KR | 10-2010-0028778 A | 3/2010 |
| KR | 10-2013-0092229 A | 8/2013 |

\* cited by examiner

ORGANIC LIGHT EMITTING DIODE DISPLAY, DRIVING METHOD THEREOF, AND MANUFACTURING METHOD THEREOF

CROSS-REFERENCE TO RELATED APPLICATIONS

This is a divisional application based on pending application Ser. No. 14/542,900, filed Nov. 17, 2014, the entire contents of which is hereby incorporated by reference.

Korean Patent Application No. 10-2014-0086975, filed on Jul. 10, 2014, and entitled, "Organic Light Emitting Diode Display, Driving Method Thereof, and Manufacturing Method Thereof," is incorporated by reference herein in its entirety.

BACKGROUND

1. Field

One or more embodiments described herein relate to an organic light emitting diode display, a method of driving such a display, and a manufacturing method of manufacturing such a display.

2. Description of the Related Art

An organic light emitting display generates images based on light from organic light emitting diodes (OLEDs). This type of display has reduced power consumption and improved response speed, viewing angle, and contrast ratio compared with other display technologies. An OLED display is able to achieve this level of performance, at least in part, because OLEDs are self-emissive elements and therefore no additional light source (e.g., backlight) is required. Furthermore, OLED displays have reduced thickness and provide improved luminance and color purity. These types of displays are also flexible.

The pixels (or sub-pixels) of an OLED display emit primary colors such as red, blue, green, white, and the like. The light from these pixels (or sub-pixels) is combined to express a full range of colors from each pixel.

Each pixel (or sub-pixel) a pixel driving circuit for driving an OLED with a light emission current corresponding to a data signal. The OLED includes a light emission layer between a pixel electrode and an opposing electrode. The pixel and opposing electrodes serve as anode and cathode electrodes. In operation, electrons injected from the cathode and holes injected from the anode combine in the light emission layer to generate excitons. When the excitons change state, they release energy to emit light.

The opposing electrode may be formed across the pixels and may be applied with a fixed common voltage. In one example of the pixel driving circuit, the pixel driving circuit may include a driving transistor coupled to the OLED, at least one capacitor coupled to the driving transistor, and a switching transistor coupled to the driving transistor.

Additionally, the pixel driving circuit is coupled to a driving voltage terminal ELVDD. The switching transistor has a source terminal coupled to a data line and a gate terminal coupled to a gate line. The switching transistor is turned on when the gate signal from the gate line is a gate-on voltage, and is turned off when the gate signal is a gate-off voltage. When the switching transistor is turned on, the data signal transferred from the data line to the capacitor and the driving transistor.

The capacitor is coupled to the driving voltage ELVDD to hold the data signal for one frame. The capacitance of the capacitor serves to compensate a threshold voltage of the driving transistor, and thus has a great effect on light emission quality of the OLED display.

When the driving transistor is turned on by the data signal, the driving transistor adjusts the amount of current of the OLED on a path from the driving voltage ELVDD to the common voltage. The pixel emits light depending on the amount of current. In this example, the driving transistor is always turned on by the switching transistor and a data signal of a common connection terminal of the capacitor, to thereby continuously provide current to the OLED.

When the driving transistor for driving the OLED is driven for a long time, its threshold voltage or mobility varies. As a result, an expected luminance may not be generated. Particularly, when the characteristics of the semiconductor material in the driving transistors are not uniform throughout the display device, a luminance deviation may be generated among the pixels to degrade display quality.

SUMMARY

In accordance with one embodiment, an organic light emitting diode display includes a substrate; a semiconductor pattern on the substrate and including channel regions; a first gate insulating layer on the semiconductor pattern; a first gate conductive layer on the first gate insulating layer; a second gate insulating layer on the first gate conductive layer; and a second gate conductive layer on the second gate insulating layer, wherein the channel regions include a first channel region that overlaps the first gate conductive layer and a second channel region that does not overlap the first gate conductive layer, and wherein the first channel region and the second channel region have different doping concentrations. The second gate conductive layer may overlap each of the channel regions.

The first channel region may include a driving channel region in a driving transistor and a first switching channel region in a first switching transistor, the second channel region may include a second switching channel region in a second switching transistor, and the first switching transistor and the second switching transistor may have different threshold voltages.

The first gate conductive layer and the second gate conductive layer that respectively overlap the driving channel region may form a storage capacitor along with the second gate insulating layer. The first gate conductive layer overlapping the driving channel region may receive a driving voltage. The first gate conductive layer overlapping the first channel region may have substantially an island shape. The first switching transistor may include a source electrode coupled to a drain electrode of the driving transistor.

In accordance with another embodiment, an organic light emitting diode display includes a driving transistor including a driving gate electrode coupled to a storage capacitor; a first switching transistor including a first source electrode coupled to a driving drain electrode of the driving transistor; and a second switching transistor including a second drain electrode coupled to a driving source electrode of the driving transistor, wherein a second source electrode of the second switching transistor receives a driving voltage, and wherein a channel region of the first switching transistor and a channel region of the second switching transistor have different doping concentrations.

The doping concentrations of the channel region of the first switching transistor and a channel region of the driving transistor may be substantially equal. The first gate conductive layer may include a portion between a gate electrode of the first switching transistor and the channel region of the first switching transistor. The first gate conductive layer may include a portion between the driving gate electrode of the driving transistor and the channel region of the driving transistor.

In accordance with another embodiment, a method for manufacturing an organic light emitting diode display includes forming a semiconductor pattern layer by laminating and then patterning a semiconductor layer on a substrate; forming a first gate insulating layer on the semiconductor pattern layer; forming a first gate conductive layer on the first gate insulating layer; forming first and second channel regions having different doping concentrations by doping the semiconductor pattern layer with an impurity after forming the first gate conductive layer; forming a second gate insulating layer on the first gate conductive layer; forming a second gate conductive layer on the second gate insulating layer; and forming a portion of the semiconductor pattern layer as a conductive region by doping the semiconductor pattern with an impurity after forming the second gate conductive layer.

The first channel region may overlap the first gate conductive layer, and the second channel region may not overlap the first gate conductive layer. The second gate conductive layer may overlap the first and second channel regions.

The method may include channel-doping the semiconductor pattern layer entirely by injecting an impurity before forming the first gate insulating layer and after forming the semiconductor pattern layer. The method may include forming an interlayer insulating layer on the second gate conductive layer; and forming a data conductive layer on the interlayer insulating layer.

In accordance with another embodiment, a method for driving an organic light emitting diode (OLED) display includes applying a driving voltage to a source electrode of a driving transistor, by turning off a switching transistor and a compensation transistor and turning on an initialization transistor, an operation control transistor, and a light emission control transistor; applying an initialization voltage to a gate electrode of the driving transistor, by turning on the initialization transistor and turning off the switching transistor, the compensation transistor, the operation control transistor, and the light emission control transistor; applying a data signal to the source electrode of the driving transistor, by turning off the initialization transistor, the operation control transistor, the light emission control transistor, and a bypass transistor and turning on the switching transistor and the compensation transistor; and controlling an OLED to emit light with luminance corresponding to the data signal, by turning off the switching transistor, the compensation transistor, the initialization transistor, and the bypass transistor and turning on the operation control transistor and the light emission control transistor, wherein applying the driving voltage includes turning off the light emission control transistor earlier than the operation control transistor, and wherein a threshold voltage of the light emission control transistor is different from that of the operation control transistor.

A channel region of the light emission control transistor and a channel region of the operation control transistor may have different doping concentrations. The light emission control transistor and the operation control transistor are controlled by a same signal. The bypass transistor is coupled between a source electrode of the initialization transistor and a drain electrode of the light emission control transistor, and wherein the bypass transistor and the switching transistor are controlled by a same signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
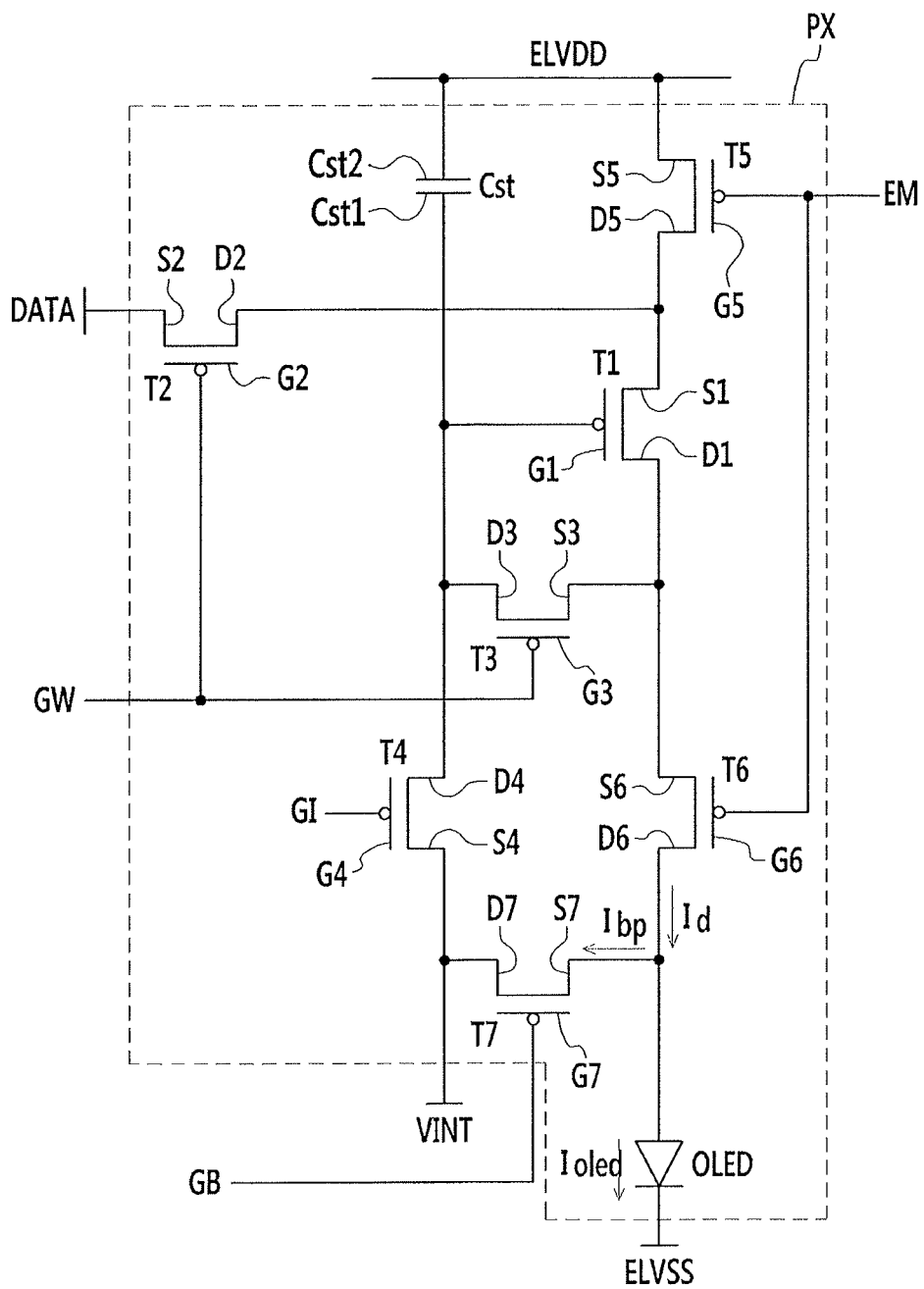
FIG. 1A illustrates an embodiment of a pixel of an OLED display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

It will be understood that when an element such as a layer, film, region, or substrate is referred to as being "on" another element, it may be directly on the other element or intervening elements may also be present. In contrast, when an element is referred to as being "directly on" another element, there are no intervening elements present. When it is described that an element is "coupled" to another element, the element may be "directly coupled" to the other element or "electrically coupled" to the other element through a third element.

FIG. 1A illustrates an embodiment of a pixel PX of an OLED display. Referring to FIG. 1A, the pixel PX includes a plurality of transistors, a storage capacitor Cst, and an organic light emitting diode OLED. The transistors include a driving thin film transistor T1, a switching thin film transistor T2, a compensation transistor T3, an initialization transistor T4, an operation control transistor T5, a light emission control transistor T6, and a bypass transistor T7. The compensation transistor T3, the initialization transistor T4, the operation control transistor T5, the light emission control transistor T6, and the bypass transistor T7 are switching transistors.

A gate electrode G1 of the driving transistor T1 is coupled to one end Cst1 of a storage capacitor Cst, a source electrode S1 of the driving transistor T1 is coupled to a driving voltage line for transmitting a driving voltage ELVDD via the operation control transistor T5, and a drain electrode D1 of the driving transistor T1 is electrically coupled to an anode of the OLED via the light emission control transistor T6. The driving transistor T1 receives a data signal DATA according to a switching operation of the switching transistor T2 to supply a light emission current Ioled to the OLED.

A gate electrode G2 of the switching transistor T2 is coupled to a gate line for transmitting a gate signal GW, a source electrode S2 of the switching transistor T2 is coupled to a data line for transmitting the data signal DATA, and a drain electrode D2 of the switching transistor T2 is coupled to the driving voltage line for transmitting the driving voltage ELVDD via the operation control transistor T5 while being coupled to the source electrode S1 of the driving transistor T1.

The switching transistor T2 may be turned on according to the gate signal GW, and may perform the switching operation for transmitting the data signal DATA transmitted from the data line to the source electrode of the driving transistor T1.

The gate line may cross the data line. The driving voltage line may cross the data line.

A gate electrode G3 of the compensation transistor T3 is directly coupled to the gate line for transmitting the gate signal GW, a source electrode S3 of the compensation transistor T3 is coupled to the anode of the OLED via the light emission control transistor T6 while being coupled to the drain electrode D1 of the driving transistor T1, and a drain electrode D3 of the compensation transistor T3 is coupled to one end Cst1 of the storage capacitor Cst, a drain electrode D4 of the initialization transistor T4, and the gate electrode G1 of the driving transistor T1.

The compensation transistor T3 is turned on according to the gate signal GW to couple the gate and drain electrodes G1 and D1 of the driving transistor T1 to each other, thereby diode-connecting the driving transistor T1.

A gate electrode G4 of the initialization transistor T4 is coupled to a previous gate line for transmitting a gate signal GI, a source electrode S4 of the initialization transistor T4 is coupled to an initialization voltage line for transmitting an initialization voltage VINT, and the drain electrode D4 of the initialization transistor T4 is coupled to one end Cst1 of the storage capacitor Cst, the drain electrode D3 of the compensation transistor T3, and the gate electrode G1 of the driving transistor T1.

The gate signal GI may transmit a gate-on voltage earlier than the gate signal GW. Gate-on voltage periods of the gate signal GW and the gate signal GI may not overlap with each other.

The initialization transistor T4 is turned on according to the gate signal GI to transmit the initialization voltage VINT to the gate electrode G1 of the driving transistor T1, thereby performing an initializing operation for initializing a voltage of the gate electrode G1 of the driving transistor T1.

A gate electrode G5 of the operation control transistor T5 is coupled to a light emission control line for transmitting a light emission control signal EM, a source electrode S5 of the operation control transistor T5 is coupled to the driving voltage line for transmitting the driving voltage ELVDD, and a drain electrode D5 of the operation control transistor T5 is coupled to the source electrode S1 of the driving transistor T1 and the drain electrode D2 of the switching transistor T2.

A gate electrode G6 of the light emission control transistor T6 is coupled to the light emission control line for transmitting the light emission control signal EM, a source electrode S6 of the light emission control transistor T6 is coupled to the drain electrode D1 of the driving transistor T1 and the source electrode S3 of the compensation transistor T3, and a drain electrode D6 of the light emission control transistor T6 is electrically coupled to the anode of the OLED.

The operation control transistor T5 and the light emission control transistor T6 are simultaneously turned on according to the light emission control signal EM to transmit the driving voltage ELVDD to the source electrode S1 of the driving transistor T1 and to couple the OLED to the driving transistor T1, thereby allowing the light emission current Ioled to flow through the OLED.

A gate electrode G7 of the bypass transistor T7 is coupled to a bypass control line for transmitting a bypass signal GB, a source electrode S7 of the bypass transistor T7 is coupled to the drain electrode D6 of the light emission control transistor T6 and the anode of the OLED, and a drain electrode D7 of the bypass transistor T7 is coupled to the initialization voltage line for transmitting the initialization voltage VINT and the source electrode S4 of the initialization transistor T4.

The other end Cst2 of the storage capacitor Cst is coupled to the driving voltage line, and a cathode of the OLED is coupled to a common voltage ELVSS. Accordingly, the OLED receives the driving current Id from the driving transistor T1 and emits light to display an image.

As an example, a driving method of an OLED display according to one embodiment is described with reference to FIG. 1B, along with FIG. 1A.

Figure 1B:
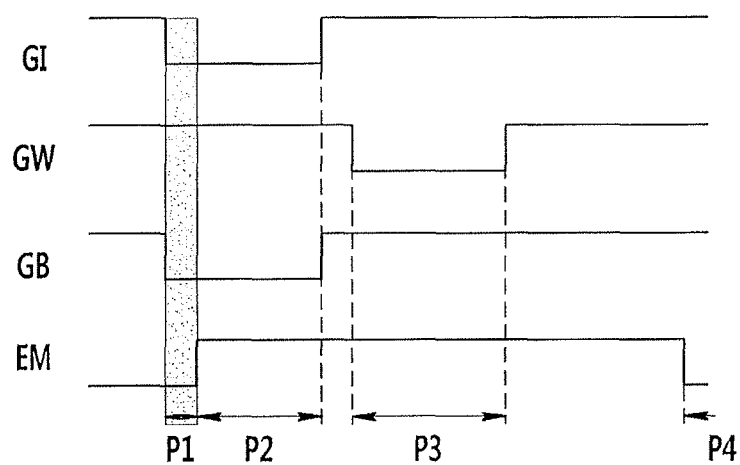
FIG. 1B illustrates an example of a driving signal of the OLED display.

FIG. 1B is a timing diagram illustrating one embodiment of a driving signal for the OLED display. In this embodiment, all of the thin film transistors in the pixel PX are PMOS transistors. In this case, a gate-on voltage is at a low level, and a gate-off voltage is at a high level.

First, in a source initialization period P1, while a gate signal GW of a gate line is at the high level and a light emission control signal EM is at the low level, a gate signal GI of the previous gate line drops to the low level.

A bypass signal GB may be a signal having the same waveform as the gate signal GI, but it is not limited thereto, and may be a signal that maintains a fixed level.

In the present embodiment, as shown in FIG. 1B, a case in which the bypass signal GB has the same waveform as the gate signal GI will be exemplarily described.

While a switching transistor T2 and a compensation transistor T3 are turned off, an initialization transistor T4, an operation control transistor T5, and a light emission control transistor T6 are turned on. In this case, a bypass transistor T7 may also be turned on. Thus, an initialization voltage VINT is applied to a gate electrode G1 of a driving transistor T1 through the turned-on initialization transistor T4, and a driving voltage ELVDD is applied to a source electrode S1 of the driving transistor T1.

Thus, the gate electrode G1 of the driving transistor T1 is initialized to the initialization voltage VINT, and the source electrode S1 of driving transistor T1 is initialized to the driving voltage ELVDD.

Particularly, when the source electrode S1 of the driving transistor T1 is applied with the driving voltage ELVDD (e.g., if the same condition as a turned-on state is satisfied), it may be initialized to the driving voltage ELVDD at the start of a corresponding frame irrespective of a data voltage that is applied to the source electrode S1 in the previous frame. This period is referred to as a source initialization period P1.

In the source initialization period P1, a bypass transistor T7 may be turned on to apply the initialization voltage VINT to an anode of an organic light emitting diode OLED. In addition, since the light emission control transistor T6 is temporarily turned on, the OLED may emit light.

As such, since the light emission control signal EM and the gate signal GI simultaneously become the low level to allow a period for which the gate-on voltage is applied, the source electrode S1 of the driving transistor T1 may be initialized at the start of the corresponding frame such that an image of each frame is displayed with the same characteristic irrespective of a changing direction of luminance, e.g., a bias direction. Thus, displaying unwanted luminance is prevented, thereby ensuring motion clarity as well as removing motion blur if a video is displayed.

However, in order to prevent unnecessary light emission of the OLED in the source initialization period P1, the operation control transistor T5 may maintain the turned-on state and the light emission control transistor T6 may be turned off in advance, right before the light emission control signal EM is changed to the high level from the low level.

For this purpose, the operation control transistor T5 and the light emission control transistor T6 may have characteristics such that they are sequentially turned off by different threshold voltages, even if the same voltage is applied to respective gate electrodes G5 and G6. Particularly, when the operation control transistor T5 and the light emission control transistor T6 are PMOS transistors, the threshold voltage of the light emission control transistor T6 needs to have a characteristic that it is moved in a negative direction compared with that of the operation control transistor T5.

According to one embodiment, threshold voltages of the operation control transistor T5 and the light emission control transistor T6 may be adjusted differently in a manufacturing process, and the light emission control transistor T6 may be turned off first while the operation control transistor T5 is in the turned-on state. Thus, the unnecessary light emission may be prevented in the source initialization period P1 for the motion clarity.

Next, the light emission control signal EM is changed to the high level in a gate initialization period P2 under substantially the same condition as in the source initialization period P1. Then, while the initialization transistor T4 is turned on and the switching transistor T2 and the compensation transistor T3 are turned off, the operation control transistor 15 and the light emission control transistor T6 are turned off. In this case, the bypass transistor T7 may maintain the turned-on state. Thus, the initialization voltage VINT is applied again to the gate electrode G1 of the driving transistor T1 through the turned-on initialization transistor T4 to reinitialize it.

Even in the gate initialization period P2, the bypass transistor T7 may be turned on to apply the initialization voltage VINT to the anode of the OLED. As such, by initializing the gate electrode G1 of the driving transistor T1, the driving transistor T1 may display an image of each frame with the same characteristic irrespective of the final voltage in the previous frame. Thus, displaying unwanted luminance is prevented, thereby ensuring motion clarity as well as removing motion blur if a video is displayed.

Next, in a data writing period P3, while the gate signal GI of the previous gate line is at the high level and the light emission control signal EM is at the high level, the gate signal GW of the gate line drops to the low level. In this case, the bypass signal GB is at the high level. Then, while the initialization transistor T4, the operation control transistor T5, the light emission control transistor T6, and the bypass transistor T7 are cut off, the switching transistor T2 and the compensation transistor T3 are turned on. In this case, the driving transistor T1 is diode-connected by the turned-on compensation transistor T3.

Accordingly, current flows between the source electrode S1 and a drain electrode D1 of the turned-on driving transistor T1, and voltage levels of the drain electrode D1 and the gate electrode G1 vary until a voltage difference between the two electrodes is equal to an absolute value of the threshold voltage Vth of the driving transistor T1.

Then, a compensation voltage (DATA−|Vth|) which is decreased by the absolute value of the threshold voltage Vth of the driving transistor T1 from a voltage level of a data signal DATA is applied to the gate electrode G1 of the driving transistor T1.

The driving voltage ELVDD and the compensation voltage (DATA−|Vth|) are respectively applied to opposite ends Cst1 and Cst2 of the storage capacitor Cst, and charges corresponding to a voltage difference between the opposite ends of the storage capacitor Cst are stored therein. A section between the gate initialization period P2 and the data writing period P3 may be omitted as a margin period for ensuring a rising time of the gate signal GI.

Next, in a light emission period P4, while the gate signal GI, the gate signal GW, and the bypass signal GB are at the high level, the light emission control signal EM is changed to the low level. Then, while the switching transistor T2, the compensation transistor T3, the initialization transistor T4, and the bypass transistor T7 are cut off, the operation control transistor T5 and the light emission control transistor T6 are turned on.

A driving current Id is generated due to a voltage difference between the voltage of the gate electrode G1 of the driving transistor T1 and the driving voltage ELVDD, and the driving current Id is supplied to the OLED through the turned-on light emission control transistor T6. In this case, the voltage of the gate electrode G1 of the driving transistor T1 is a voltage in which the threshold voltage is compensated in the data writing period P3.

For the light emission period P4, a source-gate voltage Vgs of the driving transistor T1 is maintained at the ELVDD−(DATA−|Vth|) by storage capacitor Cst.

According to a current-voltage relationship of the driving transistor T1, the driving current Id may be proportional to the square of the source-gate voltage Vgs of the driving transistor T1 being subtracted by an absolute value of the threshold voltage Vth, that is, (ELVDD−DATA)$^2$. Thus, the driving current Id may be determined irrespective of the threshold voltage Vth of the driving transistor T1. Accordingly, a deviation of the threshold voltage Vth of the driving transistor T1 may be compensated in addition to preventing luminance of the OLED display from becoming non-uniform.

In the light emission period P4, the bypass transistor T7 may be in a turned-off state. In the light emission period P4, the bypass signal BP may maintain a predetermined level for always turning on the bypass transistor T7. Accordingly, the bypass transistor T7 is turned off, and in this state, the driving current Id may be partially drawn out through the bypass transistor T7 as a bypass current Ibp.

Thus, in a frame for displaying an image of black luminance, a light emission current bled that is decreased by an amount of the bypass current Ibp from the driving current Id through the bypass transistor T7 flows through the OLED. Thus, the light emission current Ioled flows at a minimum level where the luminance of the black image may be surely expressed.

As a result, the bypass transistor T7 may be used to accurately display the image of the black luminance, thereby improving a contrast ratio of the image. A section between the data writing period P3 and the light emission period P4 may be omitted as a margin section for ensuring a data writing time.

A structure of the OLED display according to one embodiment will be described with reference to FIGS. 2 to 5.

Figure 2:
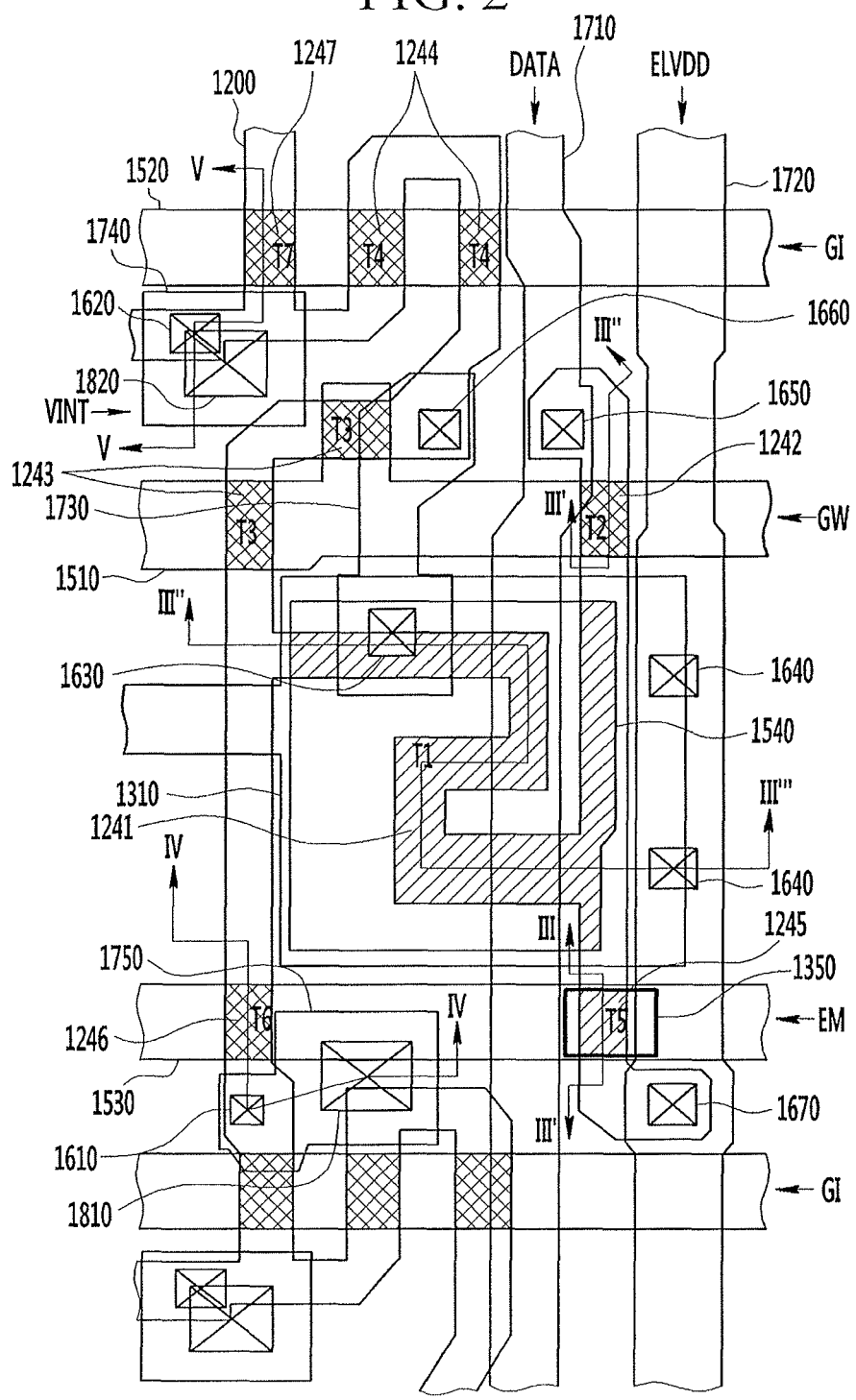
FIG. 2 illustrates a layout view of a pixel.
Figure 3:
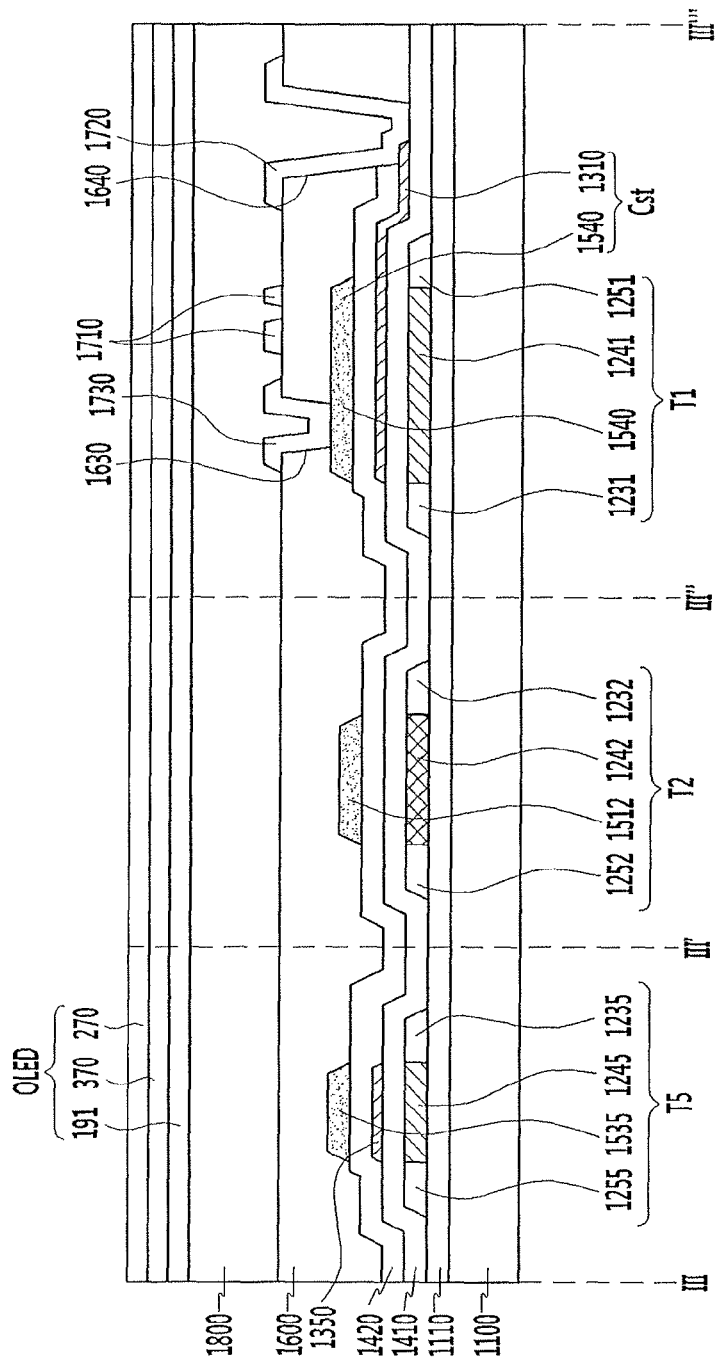
FIG. 3 illustrates the OLED display along section line III-III'-III''-III'''.
Figure 4:
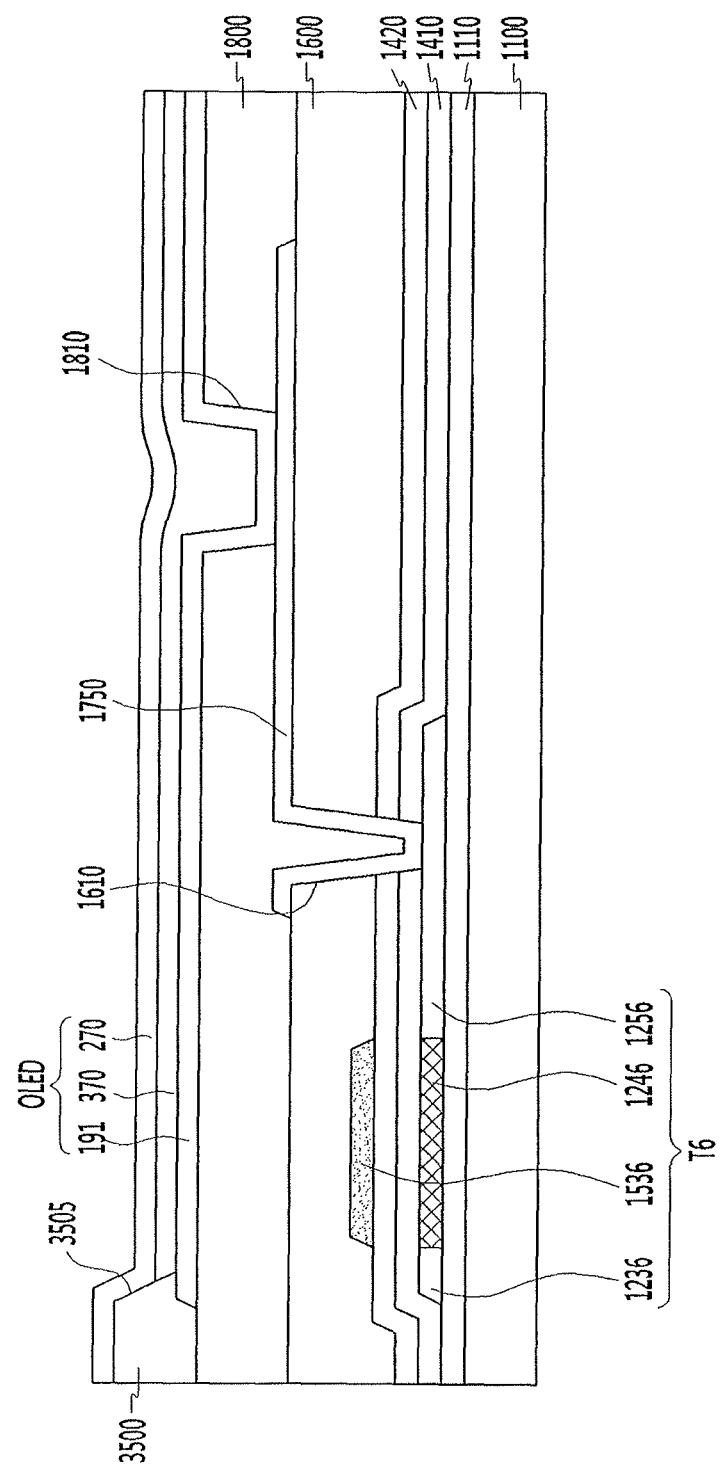
FIG. 4 illustrates the OLED display along section line IV-IV.
Figure 5:
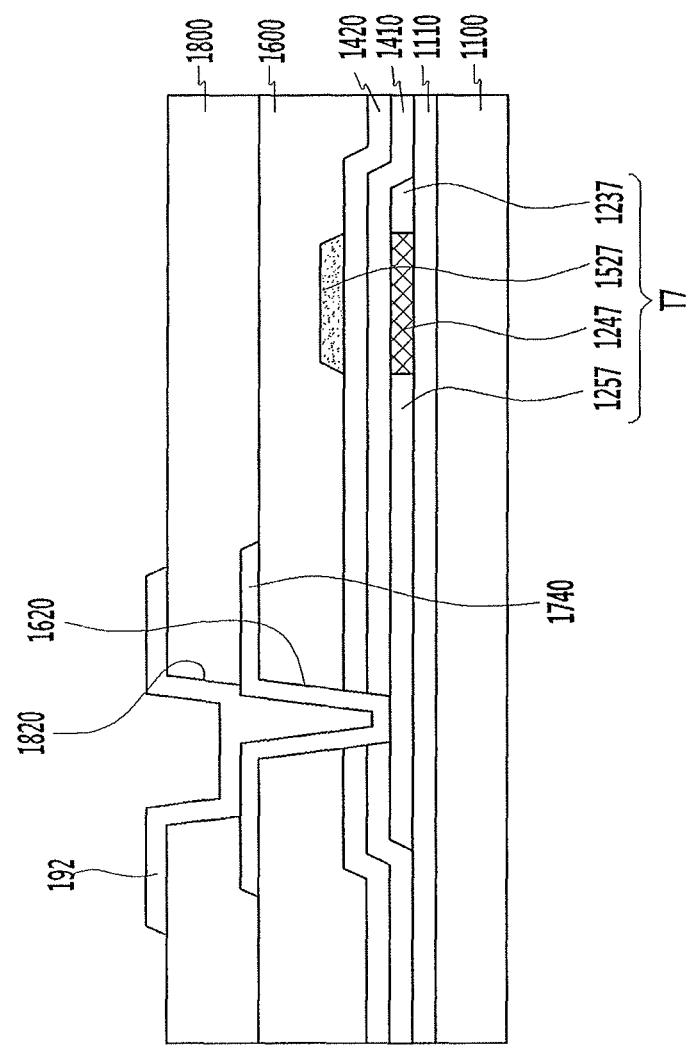
FIG. 5 illustrates the OLED display along section line V-V.

FIG. 2 is a layout the pixel, FIG. 3 is a cross-sectional view of the pixel in FIG. 2 taken along line III-III'-III"-III''', FIG. 4 is a cross-sectional view of the pixel taken along line IV-IV, and FIG. 5 is a cross-sectional view of the pixel taken along line V-V.

A buffer layer 1110 may be positioned on an insulation substrate 1100. The insulation substrate 1100 may include glass, quartz, ceramic, plastic, etc. A semiconductor pattern 1200 is positioned on the buffer layer 1110. The semiconductor pattern 1200 may be integrally connected and be curved in various shapes.

The semiconductor pattern 1200 may have a conductive property in regions except for channel regions 1241, 1242, 1245, 1246, and 1247 that form channels of respective transistors T1, T2, T3, T4, T5, T6, and T7. In FIG. 2, regions where the transistors T1 to T7 are marked correspond to the channel regions 1241, 1242, 1245, 1246, and 1247 of the respective transistors T1 to T7.

The channel regions 1241, 1242, 1245, 1246, and 1247 of the semiconductor pattern 1200 may be channel-doped with n-type impurities or p-type impurities. The respective channel regions 1241, 1242, 1245, 1246, and 1247 of the plurality of transistors T1 to T7 included in the pixel are positioned such that they are separated from each other along the semiconductor pattern 1200.

According to one embodiment, among the plurality of transistors T1 to T7, a doping degree of at least a portion of a channel region of one transistor, (e.g., a concentration of electrons or holes) may be different from those of the channel regions of the other transistors T1, T2, T3, T4, T5, T6, and T7, thereby making respective different threshold voltages different.

For example, referring to FIG. 2, doping concentrations of at least portions of the channel regions of the driving transistor T1 and the operation control transistor T5 may be different from those of the channel regions of the other transistors T2, T3, T4, T6, and T7. As a more specific example, the doping concentrations of at least the portions of the channel regions of the driving transistor T1 and the operation control transistor T5 may be lower than those of the channel regions of the other transistors T2, T3, T4, T6, and T7. Accordingly, the threshold voltage of the light emission control transistor T6 may be moved further in a negative direction than the operation control transistor T5.

In one embodiment, threshold voltages of the operation control transistor T5 and the light emission control transistor T6 may be differently adjusted in a manufacturing process. The light emission control transistor T6 may be turned off first while the operation control transistor T5 is in the turned-on state. Thus, unnecessary light emission may be prevented in the source initialization period P1 for the motion clarity.

Conductive regions of the semiconductor pattern 1200 are source regions or drain regions of the respective transistors T1 to T7, which may form source electrodes or drain electrodes of the transistors T1 to T7. Along the semiconductor pattern 1200, the source and drain electrodes of the respective transistors T1 to T7 are positioned at opposite sides of the channel regions 1241, 1242, 1245, 1246, and 1247 of the respective transistors T1 to T7. The channel regions 1241, 1242, 1245, 1246, and 1247 of the respective transistors T1 to T7 are adjacent to and coupled to the channel regions 1241, 1242, 1245, 1246, and 1247 of the corresponding transistors T1 to T7.

Referring to FIGS. 2 to 5, a driving source electrode 1231 and a driving drain electrode 1251 face each other at the opposite sides of the channel region 1241 of the driving transistor T1. A switching source electrode 1232 and a switching drain electrode are 1252 face each other at the opposite sides of the channel region 1242 of the switching transistor T2. A compensation source electrode and a compensation drain electrode face each other at the opposite sides of the channel region of the compensation transistor T3. An initialization source electrode and an initialization drain electrode face each other at the opposite sides of the channel region of the initialization transistor T4.

An operation control source electrode 1235 and an operation control drain electrode 1255 face each other at the opposite sides of the channel region 1245 of the operation control transistor T5. A light emission control source electrode 1236 and a light emission control drain electrode 1256 face each other at the opposite sides of the channel region 1246 of the light emission control transistor T6. A bypass source electrode 1237 and a bypass drain electrode 1257 face each other at the opposite sides of the channel region 1247 of the bypass transistor T7.

The conductive regions of the semiconductor pattern 1200 may be formed to be doped with the opposite or same type of doping impurities that are doped in the channel regions.

The semiconductor pattern 1200 may include polysilicon or an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

When the semiconductor pattern 1200 is formed of the oxide semiconductor, a buffer layer 1110 may be additionally interposed between the insulation substrate 1100 and the semiconductor pattern 1200 to protect the oxide semiconductor that is vulnerable to an external environment such as high temperature and the like.

A first gate insulating layer 1410 is positioned on the semiconductor pattern 1200. The first gate insulating layer 1410 may include an inorganic insulating material.

A first gate conductive layer that may include a metal and the like is positioned on the first gate insulating layer 1410. The first gate conductive layer includes, as described above, gate patterns 1310 and 1350, which overlap the channel region of the transistor in which its doping concentration is different from those of the channel regions of the other transistors.

Referring to FIGS. 2 to 5, the channel region 1241 of the driving transistor T1 may include a region overlapping the gate pattern 1310 while interposing the first gate insulating layer 1410 therebetween. The channel region 1245 of the operation control transistor T5 may include a region overlapping the gate pattern 1350 while interposing the first gate insulating layer 1410 therebetween.

The gate pattern 1310 may be an island that is confined to each pixel PX, or the gate patterns 1310 of the adjacent pixels PX may be coupled to each other. The gate pattern 1350 may be an island that is confined to each pixel PX.

A second gate insulating layer 1420 is positioned on the first gate conductive layer. The first gate insulating layer 1420 may include an inorganic insulating material.

A second gate conductive layer that may include a metal and the like is positioned on the second gate insulating layer 1420. The second gate conductive layer includes a gate line 1510, a previous gate line 1520, a light emission control line 1530, and a driving gate electrode 1540. A thickness of the aforementioned first gate conductive layer may be thinner than that of the second gate conductive layer.

The gate line 1510 transmits a gate signal GW and may substantially extend in a horizontal direction. At least two portions of the gate line 1510 may cross the semiconductor pattern 1200. The gate line 1510 includes a switching gate electrode 1512 and a compensation gate electrode that overlap the semiconductor pattern 1200.

The switching gate electrode 1512 overlaps the channel region 1242 of the switching transistor T2. The channel region 1242 of the switching transistor T2 may be substantially covered by the switching gate electrode 1512.

The compensation gate electrode overlaps the channel region of compensation transistor T3. As shown in FIG. 2, when the compensation transistor T3 includes two or more channel regions that are separated from each other, the gate line 1510 may further include an additional compensation gate electrode that upwardly or downwardly extends.

The additional compensation gate electrode may overlap channel regions other than the channel region that overlaps the compensation gate electrode. The channel region of the compensation transistor T3 may be substantially covered by the compensation gate electrode.

The previous gate line 1520 transmits a gate signal GI and may substantially extend in the horizontal direction. At least two portions of the previous gate line 1520 may cross the semiconductor pattern 1200. The previous gate line 1520 includes an initialization gate electrode and a bypass gate electrode 1527 that overlap the semiconductor pattern 1200.

The initialization gate electrode overlaps the channel region of the initialization transistor T4. As shown in FIG. 2, when the initialization transistor T4 includes two or more channel regions that are separated from each other, the previous gate line 1520 may overlap two channel regions of the initialization transistor T4. The channel region of the initialization transistor T4 may be substantially covered by the initialization gate electrode.

The bypass gate electrode 1527 overlaps the channel region 1247 of the bypass transistor T7. The channel region 1247 of the bypass transistor T7 may be substantially covered by the bypass gate electrode 1527.

The light emission control line 1530 transmits a light emission control signal EM and may substantially extend in the horizontal direction. At least two portions of the light emission control line 1530 may cross the semiconductor pattern 1200.

The light emission control line 1530 includes an operation control gate electrode 1535 and a light emission control gate electrode 1536 that overlap the semiconductor pattern 1200. The operation control gate electrode 1535 overlaps the channel region 1245 of the operation control transistor T5.

The channel region of the operation control transistor T5 may be substantially covered by the operation control gate electrode 1535. An area of the channel region of the operation control transistor T5 may be determined by an area of the operation control gate electrode 1535 that overlaps the semiconductor pattern 1200.

The operation control gate electrode 1535 includes a portion overlapping the gate pattern 1350 thereunder. The light emission control gate electrode 1536 overlaps the channel region 1246 of the light emission control transistor T6.

The channel region 1246 of the light emission control transistor T6 may be substantially covered by the light emission control gate electrode 1536.

The driving gate electrode 1540 overlaps the channel region 1241 of the driving transistor T1. The channel region 1241 of the driving transistor T1 may be substantially covered by the driving gate electrode 1540. The driving gate electrode 1540 may be an island that is confined to each pixel PX.

The channel region 1241 of the driving transistor T1 may be curved, as shown in FIG. 2, and may have an oblique shape or a zigzag shape. Accordingly, the channel region 1241 may be formed such that it is elongated in a narrow space within the pixel PX.

Thus, a driving range of voltages applied to the driving gate electrode 1540 may further extend, and luminance of light emitted from the OLED may be more minutely adjusted by varying the voltages applied to the driving gate electrode 1540. Thus, a resolution of the OLED display may be enhanced and display quality may be improved.

A shape of the channel region 1241 of the driving transistor T1 may be variously modified, and for example, various shapes such as 'reverse S', 'S', 'M', 'W', and the like may be possible.

The driving gate electrode 1540 includes a portion that overlaps the gate pattern 1310 thereunder. The driving gate electrode 1540, the driving source electrode 1231, and the driving drain electrode 1251 form the driving transistor T1 along with the channel region 1241. The switching gate electrode 1512, the switching source electrode 1232, and the switching drain electrode 1252 form the switching transistor T2 along with the channel region 1242. The compensation gate electrode, the compensation source electrode, and the compensation drain electrode form the compensation transistor T3 along with the channel region. The initialization gate electrode, the initialization source electrode, and the initialization drain electrode form the initialization transistor T4 along with the channel region.

The operation control gate electrode 1535, the operation control source electrode 1235, and the operation control drain electrode 1255 form the operation control transistor T5 along with the channel region 1245. The light emission control gate electrode 1536, the light emission control source electrode 1236, and the light emission control drain electrode 1256 form the light emission control transistor T6 along with the channel region 1246. The bypass gate electrode 1527, the bypass source electrode 1237, and the bypass drain electrode 1257 form the bypass transistor T7 along with the channel region 1247.

An interlayer insulating layer 1600 is on the second gate conductive layer. The interlayer insulating layer 1600 may include a ceramic-based material such as a silicon nitride ($SiN_x$), a silicon oxide ($SiO_x$), or the like. The interlayer insulating layer 1600 includes a contact hole 1630 that exposes the driving gate electrode 1540.

The interlayer insulating layer 1600 and the second gate insulating layer 1420 include a contact hole 1640 that exposes the gate pattern 1310. The interlayer insulating layer 1600, the first gate insulating layer 1410, and the second gate insulating layer 1420 include a contact hole 1610 that exposes the light emission control drain electrode 1256 of the light emission control transistor T6, a contact hole 1620 that exposes the bypass drain electrode 1257 of the bypass transistor T7, a contact hole 1650 that exposes the switching source electrode 1232 of the switching transistor T2, a contact hole 1660 that exposes the initialization drain electrode of the initialization transistor T4, and a contact hole 1670 that exposes the operation control source electrode 1235 of the operation control transistor T5.

A data conductive layer is on the interlayer insulating layer 1600. The data conductive layer includes a data line 1710, a driving voltage line 1720, a first connecting member 1730, a second connecting member 1740, and a third connecting member 1750. The data line 1710 transmits a data signal DATA, and may substantially extend in a vertical direction to cross the gate line 1510, the previous gate line 1520, and the light emission control line 1530. The data line 1710 is coupled to the switching source electrode 1232 of the switching transistor T2 through the contact hole 1650 to transmit the data signal DATA.

The driving voltage line 1720 transmits a driving voltage ELVDD, and may substantially extend in the vertical direction to cross the gate line 1510, the previous gate line 1520, and the light emission control line 1530. The driving voltage line 1720 is coupled to the gate pattern 1310 through the contact hole 1640 to transmit the driving voltage ELVDD.

Further, the driving voltage line 1720 is coupled to the operation control source electrode 1235 of the operation control transistor T5 through the contact hole 1670 to transmit the driving voltage ELVDD.

The first connecting member 1730 is physically and electrically coupled to the driving gate electrode 1540 through the contact hole 1630 and to the initialization drain electrode of the initialization transistor T4 or compensation drain electrode of the compensation transistor T3 through the contact hole 1660, finally electrically coupling the driving gate electrode 1540 to the initialization drain electrode or compensation drain electrode.

The second connecting member 1740 is physically and electrically coupled to the bypass drain electrode 1257 through the contact hole 1620.

The third connecting member 1750 is physically and electrically coupled to the light emission control drain electrode 1256 through the contact hole 1610.

The gate pattern 1310 receiving the driving voltage ELVDD overlaps the driving gate electrode 1540 while interposing the second gate insulating layer 1420 therebetween, thereby forming a storage capacitor Cst.

According to one embodiment, for implementation of motion clarity, threshold voltages of the operation control transistor T5 and the light emission control transistor T6 are differently adjusted. For example, as described above, in order for the light emission control transistor T6 to be turned off earlier than the operation control transistor T5 in the source initialization period P1, the threshold voltage of the light emission control transistor T6 should be moved in the negative direction.

For this purpose, a channel length of the light emission control transistor T6 may be elongated. However, in this case, a space allotted to the storage capacitor Cst may decrease as a length of the transistor increases in the limited space of the pixel PX. Then, capacitance of the storage capacitor Cst is limited to cause defects such as stain and the like in a display image.

According to one embodiment, even without elongating the channel length of the light emission control transistor T6, a doping concentration thereof may be differently adjusted compared with that of the operation control transistor T5. Thus, even if the capacitance of the storage capacitor Cst is decreased, the threshold voltages of some transistors may be made different.

A passivation layer 1800 is positioned on the data conductive layer. The passivation layer 1800 may include an organic insulating material or inorganic insulating material. The passivation layer 1800 includes a via hole 1810 that exposes the third connecting member 1750, and a via hole 1820 that exposes the second connecting member 1740.

A pixel electrode 191 and an initialization voltage line 192 are positioned on the passivation layer 1800. The pixel electrode 191 is electrically and physically coupled to the third connecting member 1750 through the via hole 1810 that is formed in the passivation layer 1800, finally being electrically coupled to the light emission control drain electrode 1256 of the light emission control transistor T6.

The initialization voltage line 192 is electrically and physically coupled to the second connecting member 1740 through the via hole 1820 that is formed in the passivation layer 1800, finally being electrically coupled to the bypass drain electrode 1257 of the bypass transistor T7 to transmit the initialization voltage VINT to the bypass drain electrode 1257. The pixel electrode 191 and the initialization voltage line 192 may include a transparent conductive material.

A pixel definition layer 3500 is formed on the passivation layer 1800. The pixel definition layer 3500 may partially cover an edge of the pixel electrode 191 and at least a part of the initialization voltage line 192. The pixel definition layer 3500 includes an opening 3505 that exposes the pixel electrode 191.

The pixel definition layer 3500 may cover both via holes 1810 and 1820. The pixel definition layer 3500 may include a polyacrylate resin and a polyimide-based resin or a silica-based inorganic material.

A light emission layer 370 is positioned on the exposed pixel electrode 191 in the opening 3505 of the pixel definition layer 3500, and an opposed electrode 270 is positioned on the light emission layer 370.

The pixel electrode 191, the light emission layer 370, and the opposed electrode 270 form the OLED. The pixel electrode 191 forms an anode of the OLED, and the opposed electrode 270 forms a cathode of the OLED.

According to another embodiment, the pixel electrode 191 may be the cathode and the opposing electrode 270 may be the anode, depending on a driving method of the OLED display. Light is emitted when holes and electrons from the pixel electrode 191 and the opposed electrode 270 are injected into the light emission layer 370. Then, excitons, formed by the combination of the injected holes and electrons, fall from an excited state to a ground state.

An encapsulation member for protecting the OLED may be formed on the opposed electrode 270, and the encapsulation member may be sealed into the insulation substrate 1100 by a sealant.

According to another embodiment, inorganic and organic layers may be alternatingly deposited on the opposed electrode 270 to form a thin film encapsulation layer without using the sealant.

Figure 6:
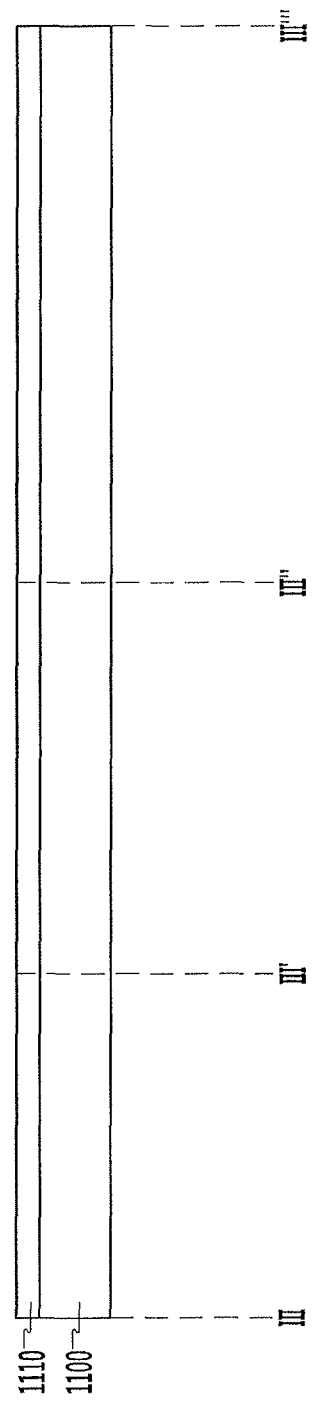
FIGS. 6 to 8 illustrate operations in an embodiment of a method for manufacturing of the OLED display the pixel along section lines III-III'-III''-III''', IV-IV, and V-V.
Figure 7:
Figure 8:
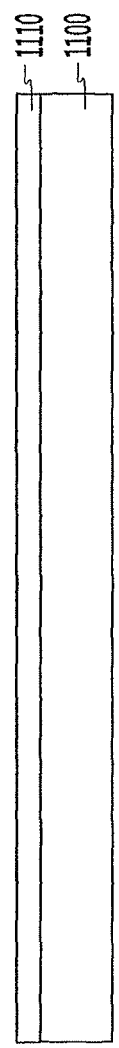
Figure 9:
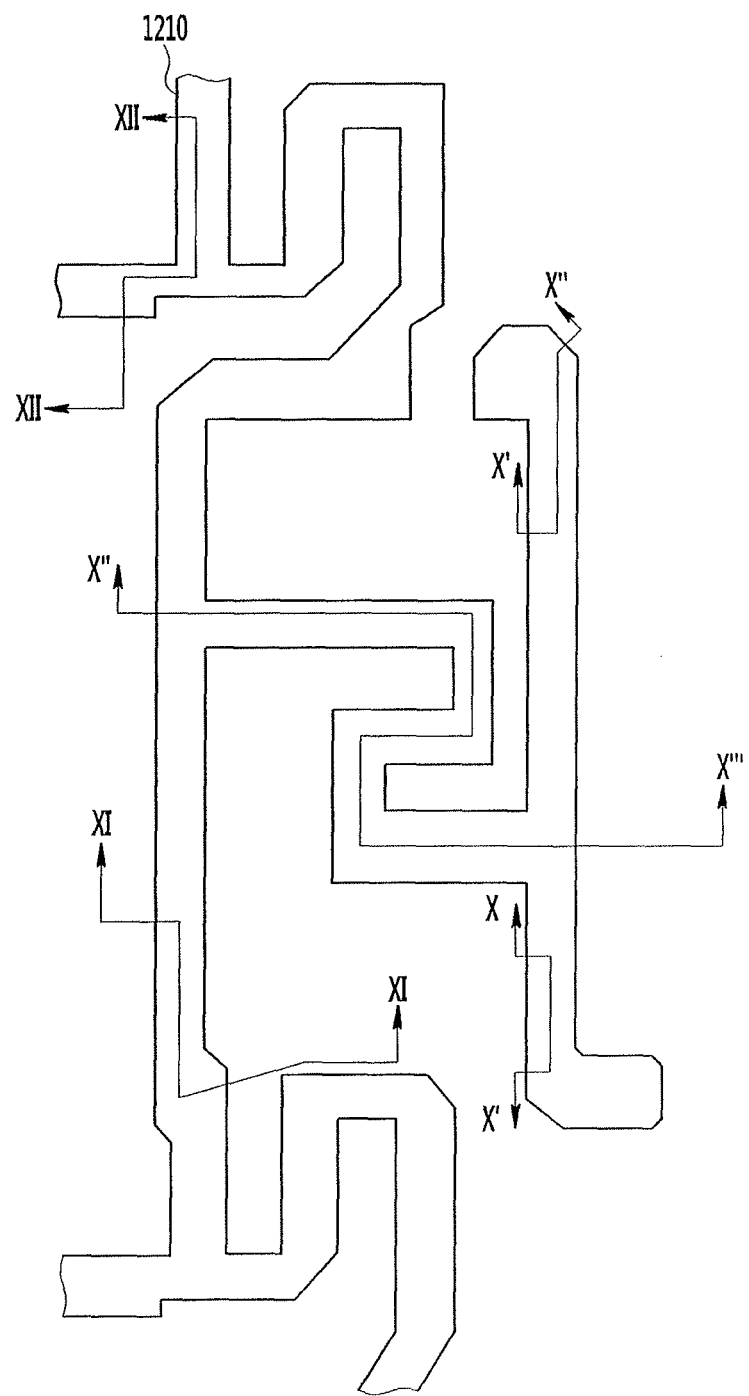
FIG. 9 illustrates a layout of the pixel after the operations of FIGS. 6 to 8.
Figure 10:
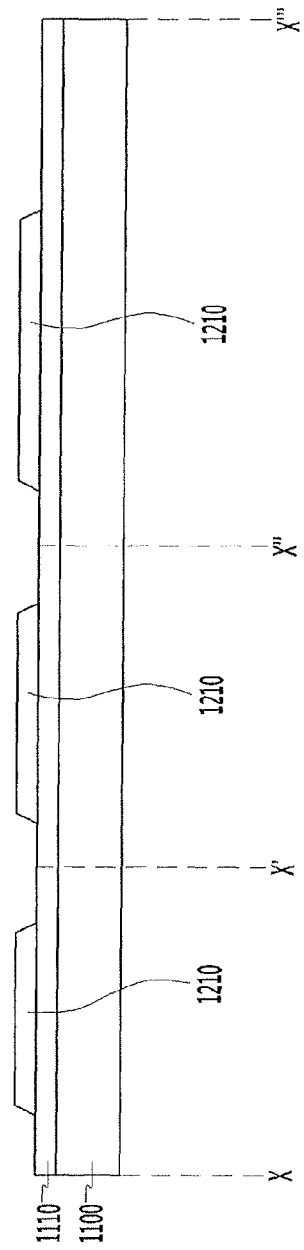
FIGS. 10 to 12 illustrate the OLED display along section lines X-X'-X''-X''', XI-XI, and XII-XII in FIG. 9.
Figure 11:
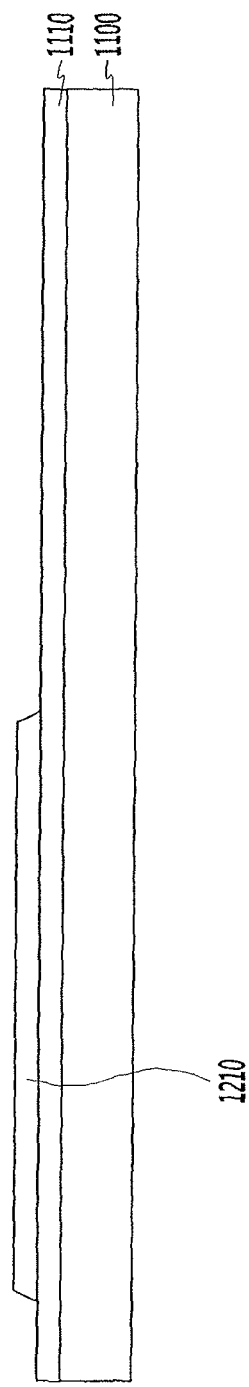
Figure 12:
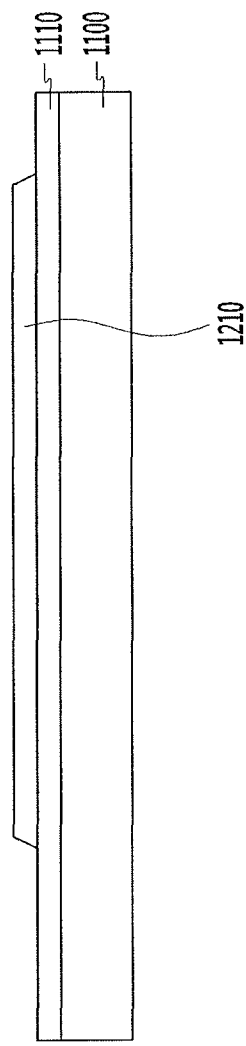
Figure 13:
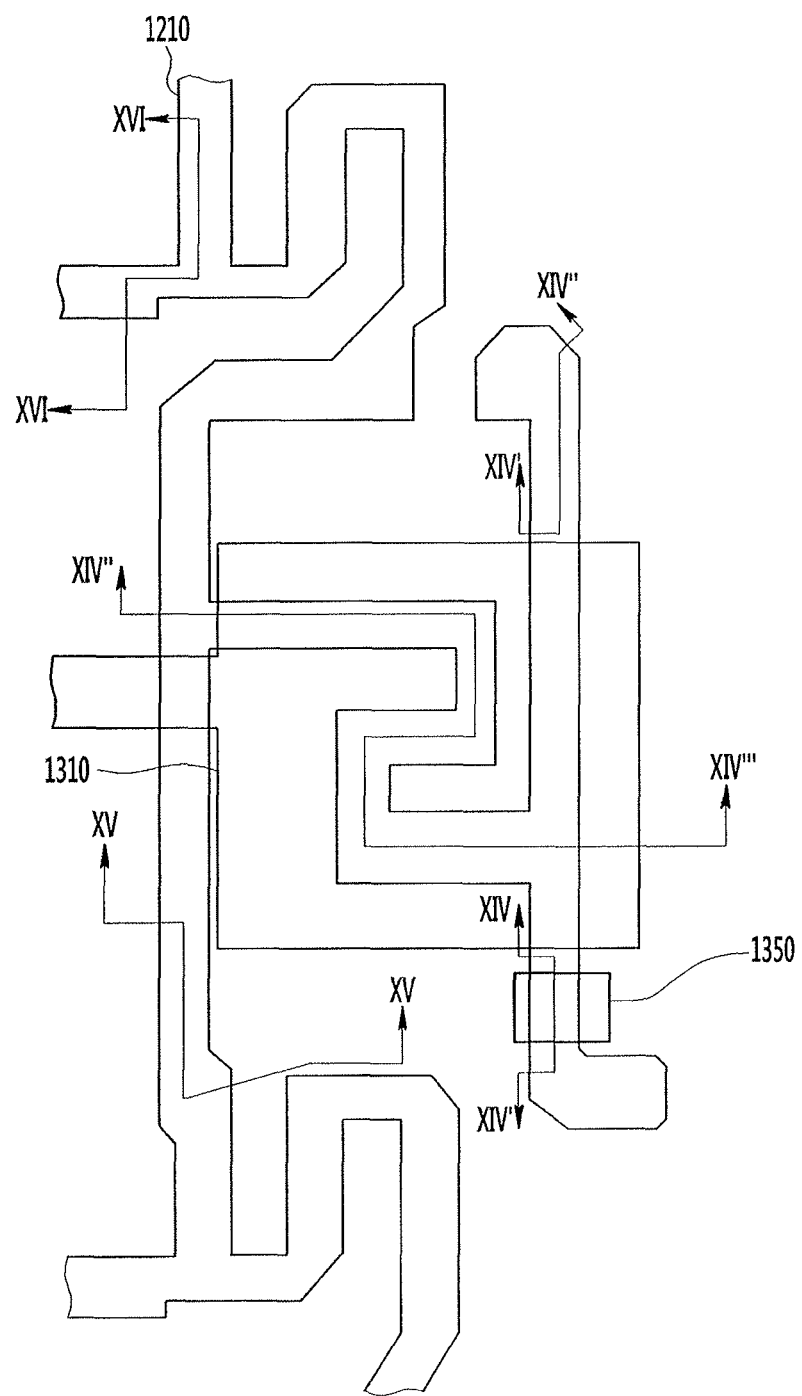
FIG. 13 illustrates the OLED display after the operations in FIGS. 9 to 12.
Figure 14:
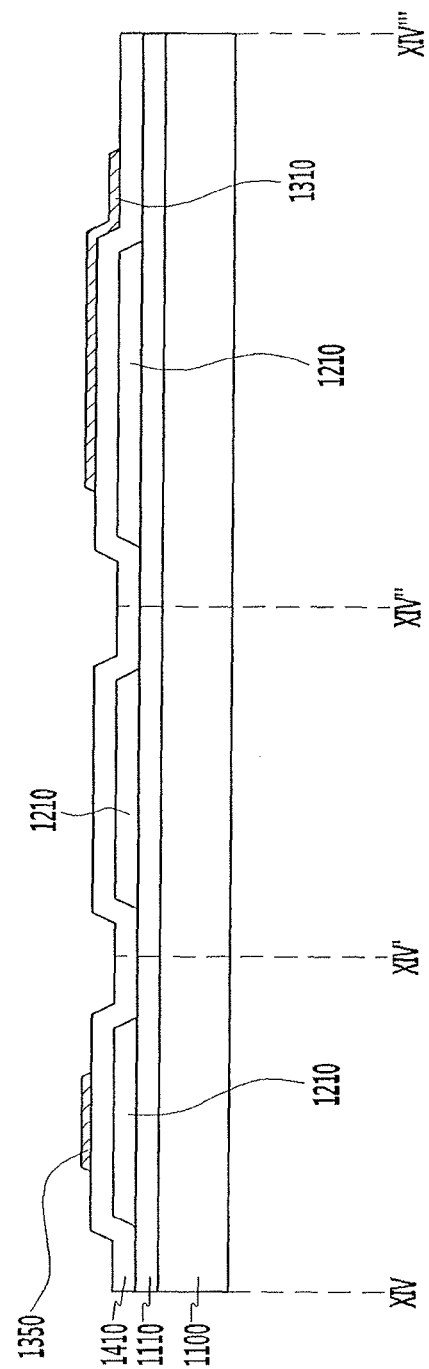
FIGS. 14 to 16 illustrate the OLED displaying FIG. 13 along section lines XIV-XIV'-XIV''-XIV''', XV-XV, and XVI-XVI.
Figure 15:
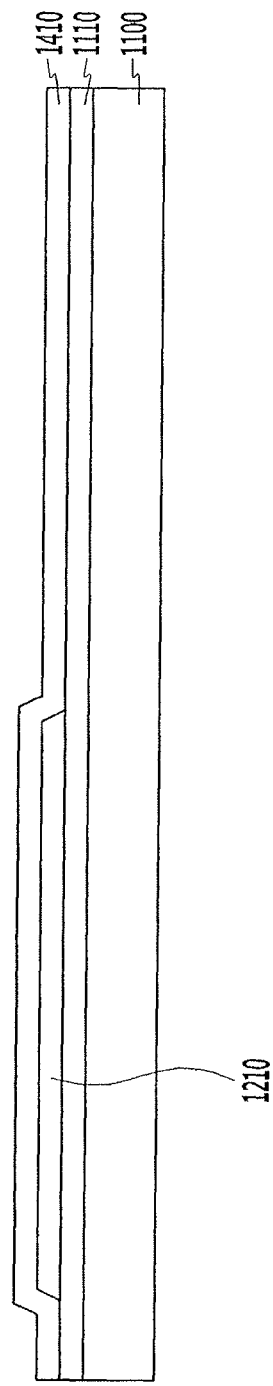
Figure 16:
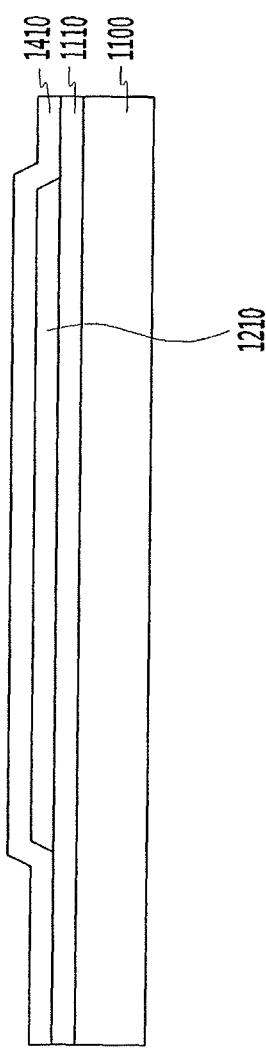
Figure 17:
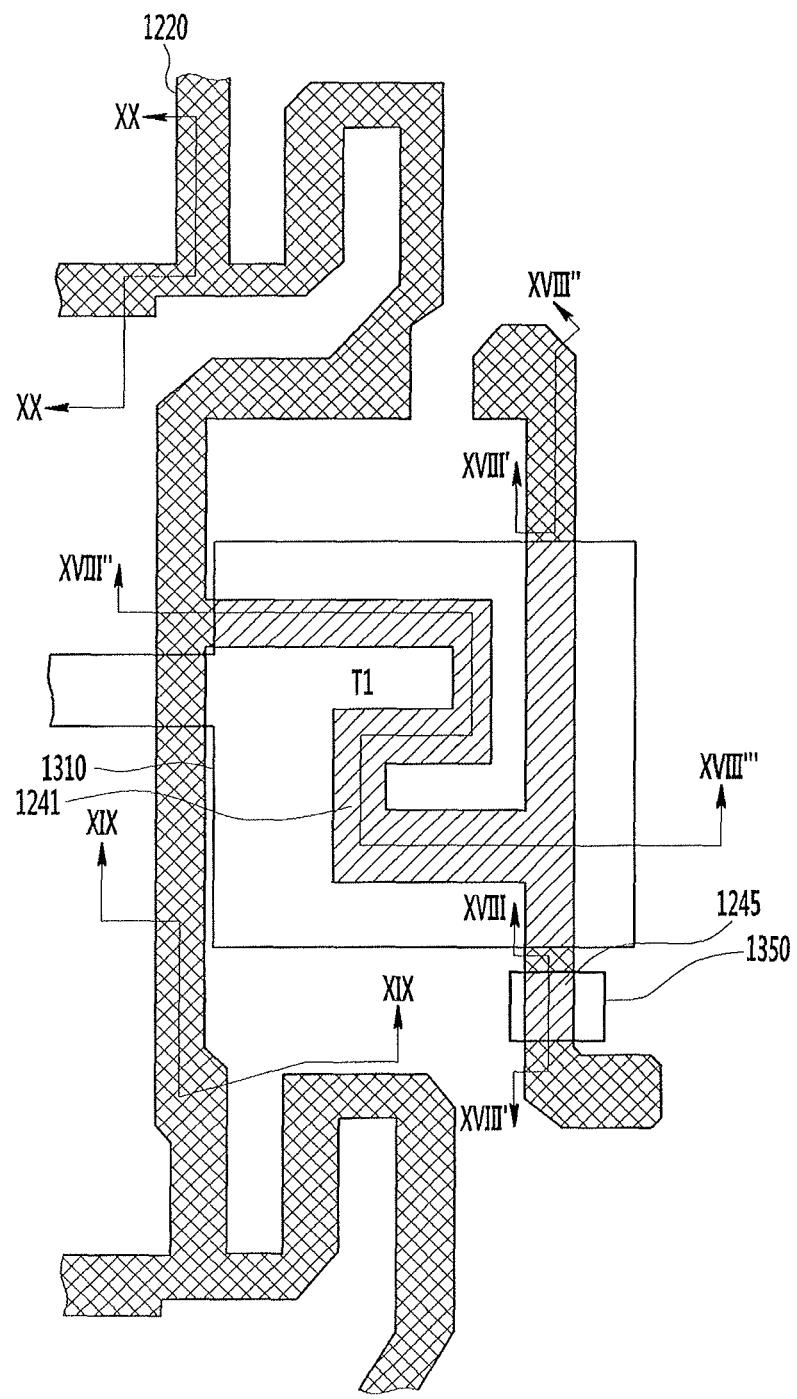
FIG. 17 illustrates a layout of the pixel after the operations in FIGS. 13 to 16.
Figure 18:
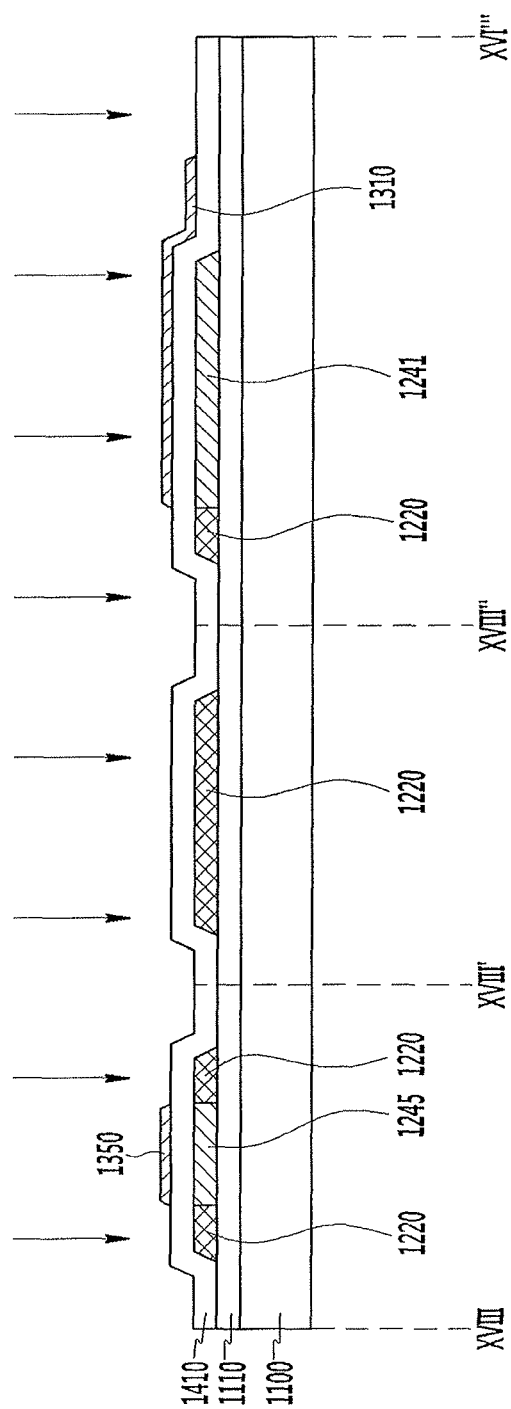
FIGS. 18 to 20 illustrate the OLED display along section lines XVIII-XVIII'-XVIII''-XVIII''', XIX-XIX, and XX-XX in FIG. 17.
Figure 19:
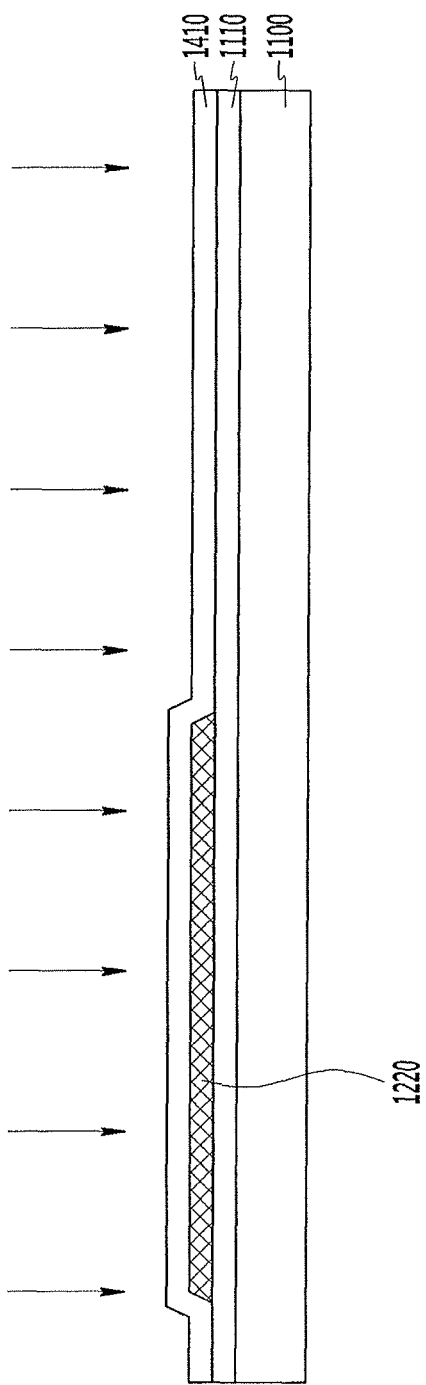
Figure 20:
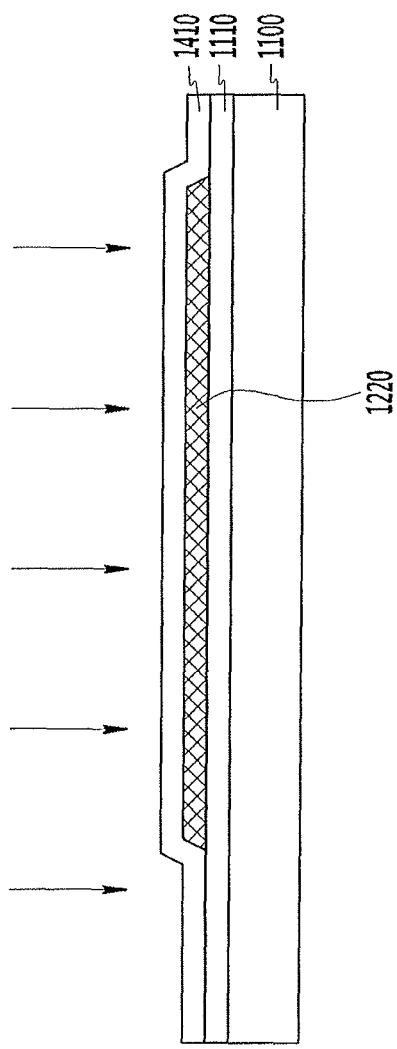
Figure 21:
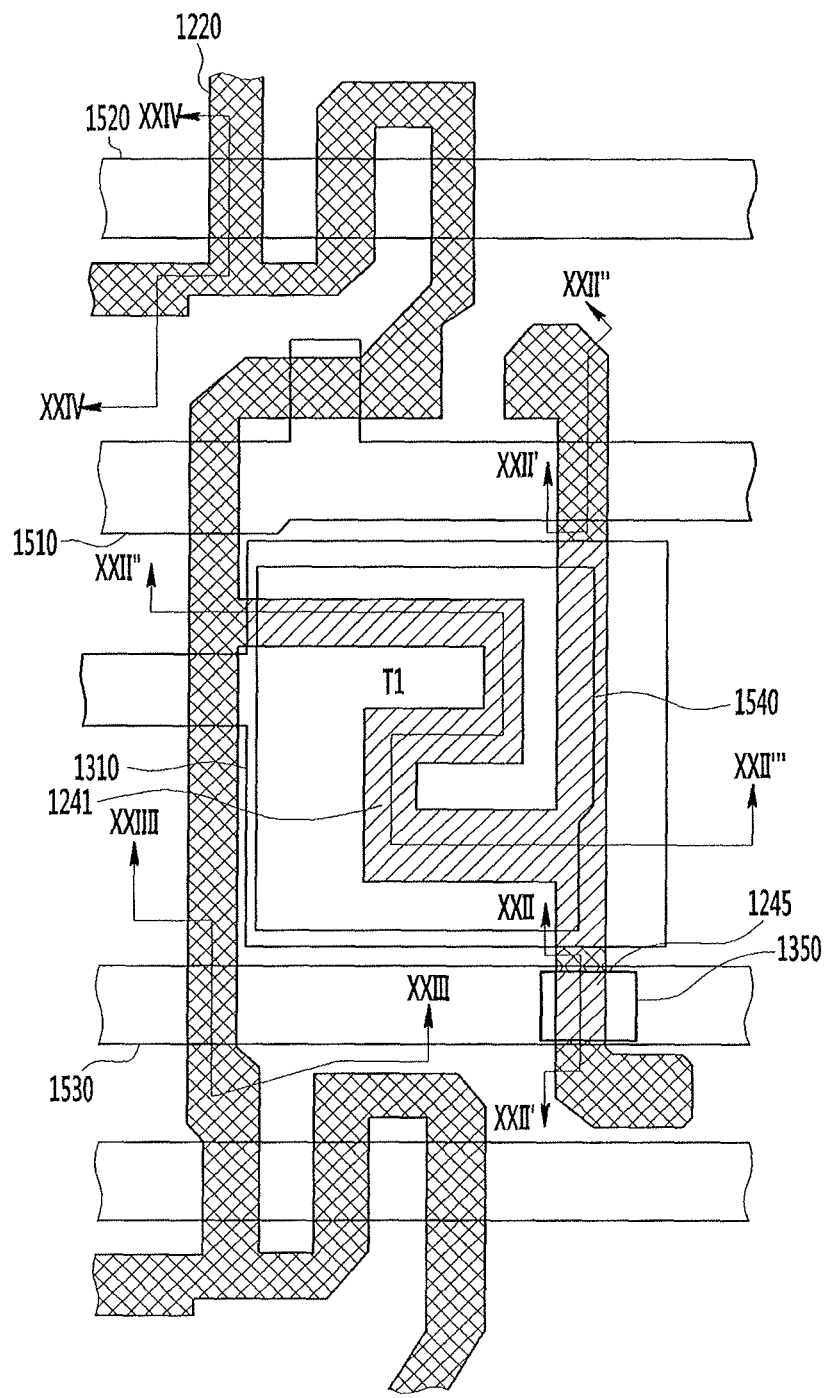
FIG. 21 illustrates a layout of the pixel after the operations in FIGS. 17 to 20.
Figure 22:
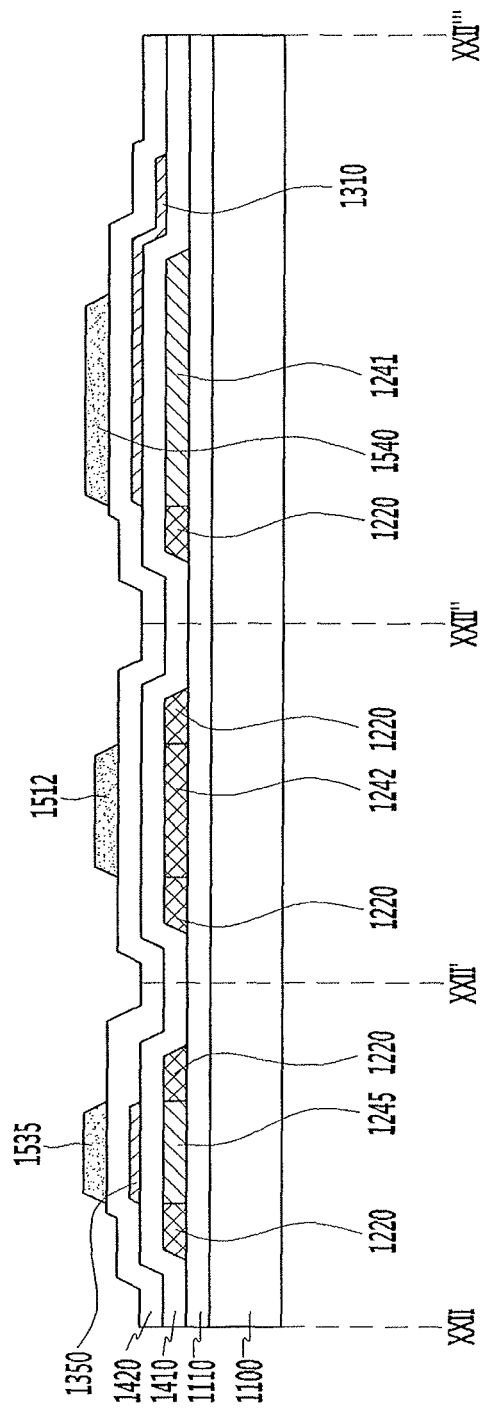
FIGS. 22 to 24 illustrate the OLED displaying FIG. 21 along section lines XXII-XXII'-XXII''-XXII''', XXIII-XXIII, and XXIV-XXIV.
Figure 23:
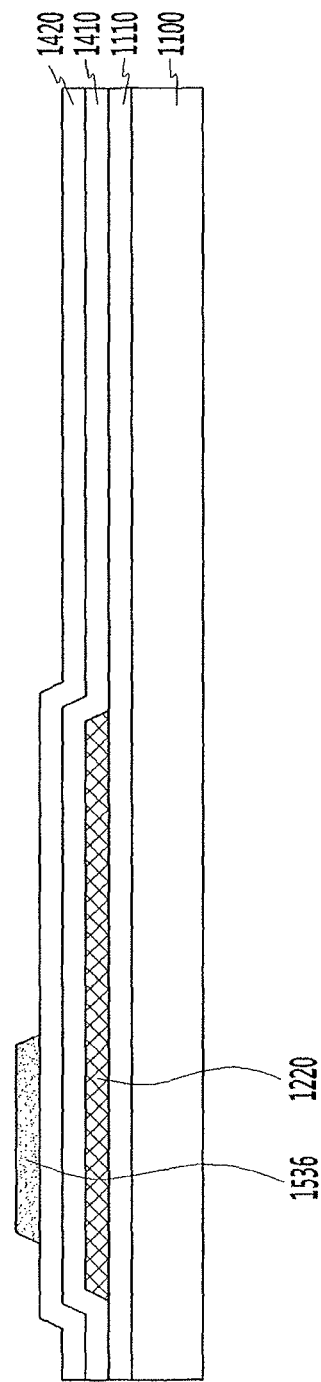
Figure 24:
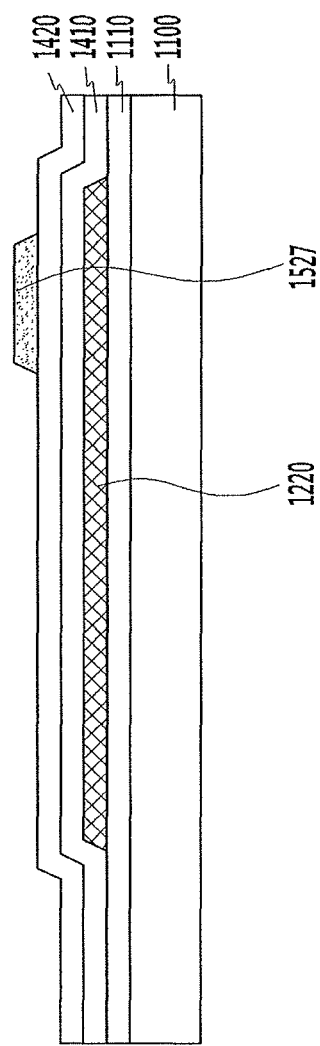
Figure 25:
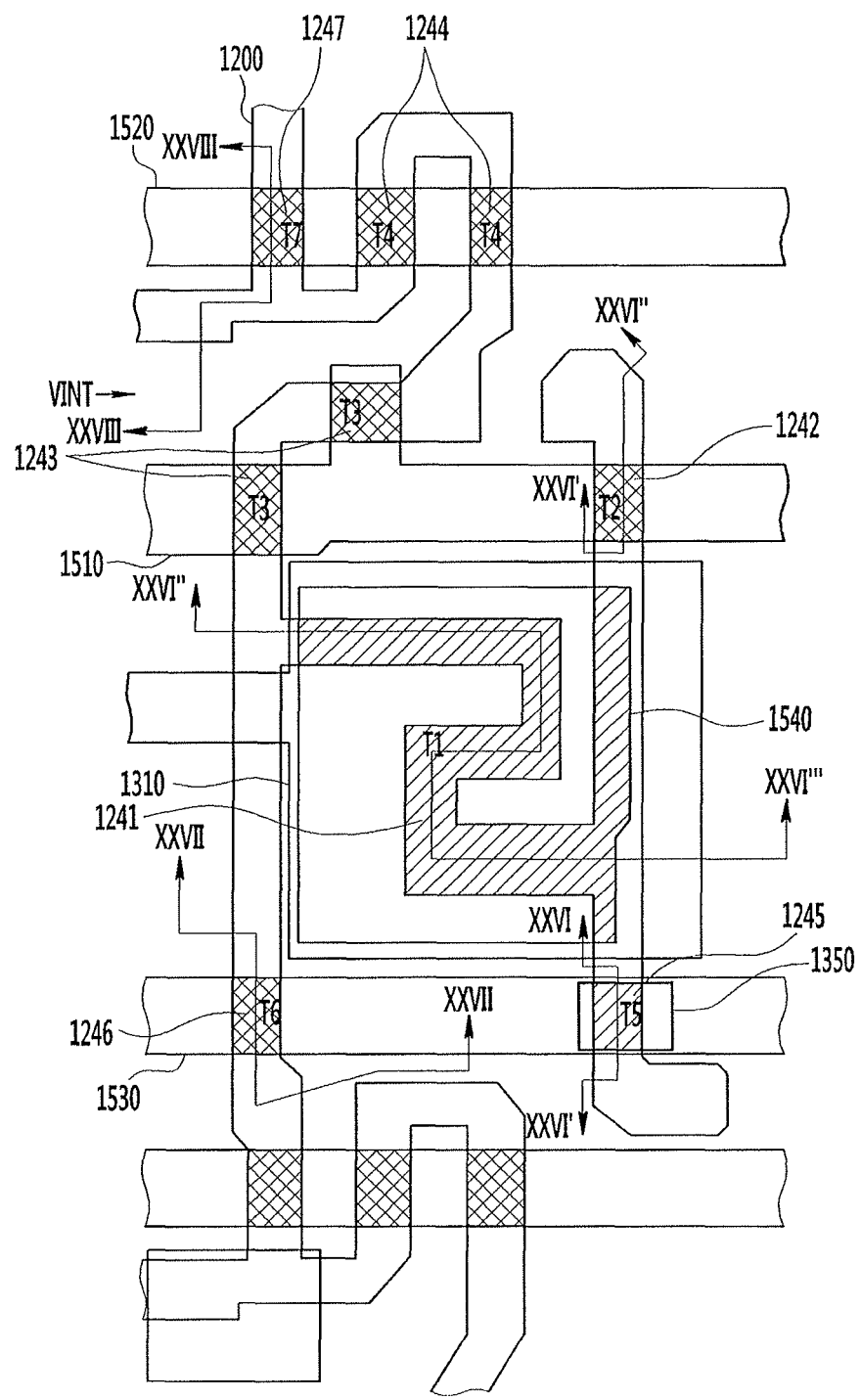
FIG. 25 illustrates a layout the pixel after the operations in FIGS. 21 to 24.
Figure 26:
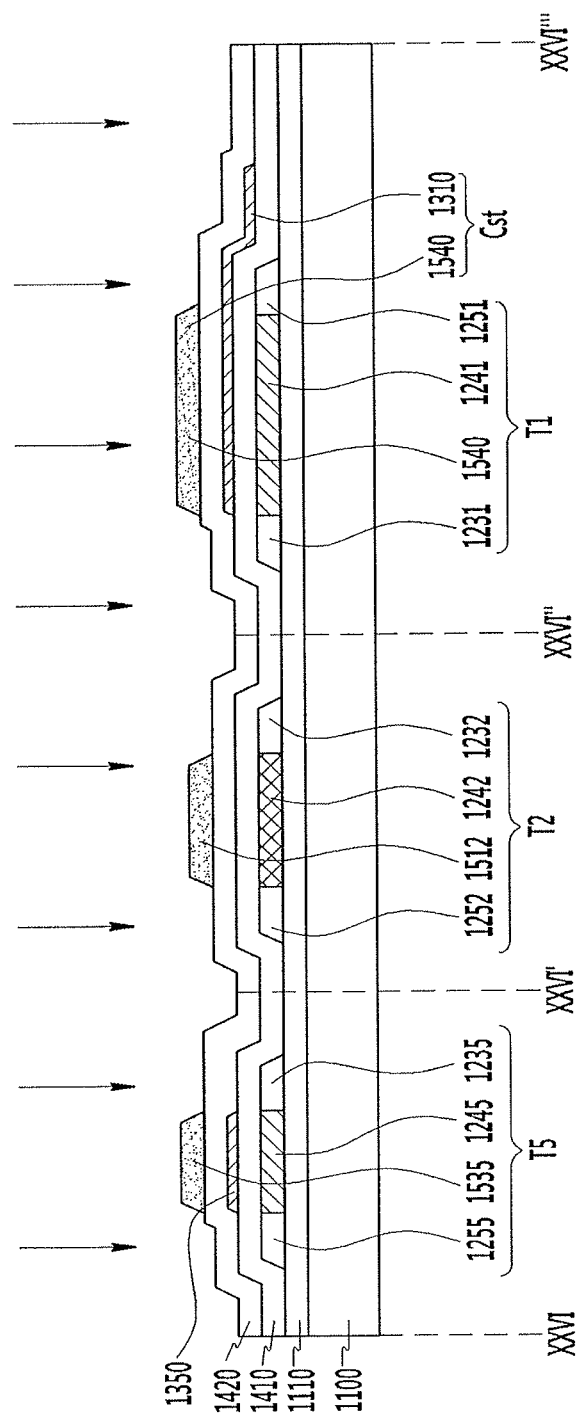
FIGS. 26 to 28 illustrate the OLED displaying FIG. 25 along section lines XXVI-XXVI'-XXVI''-XXVI''', XXVII-XXVII, and XXVIII-XXVIII.
Figure 27:
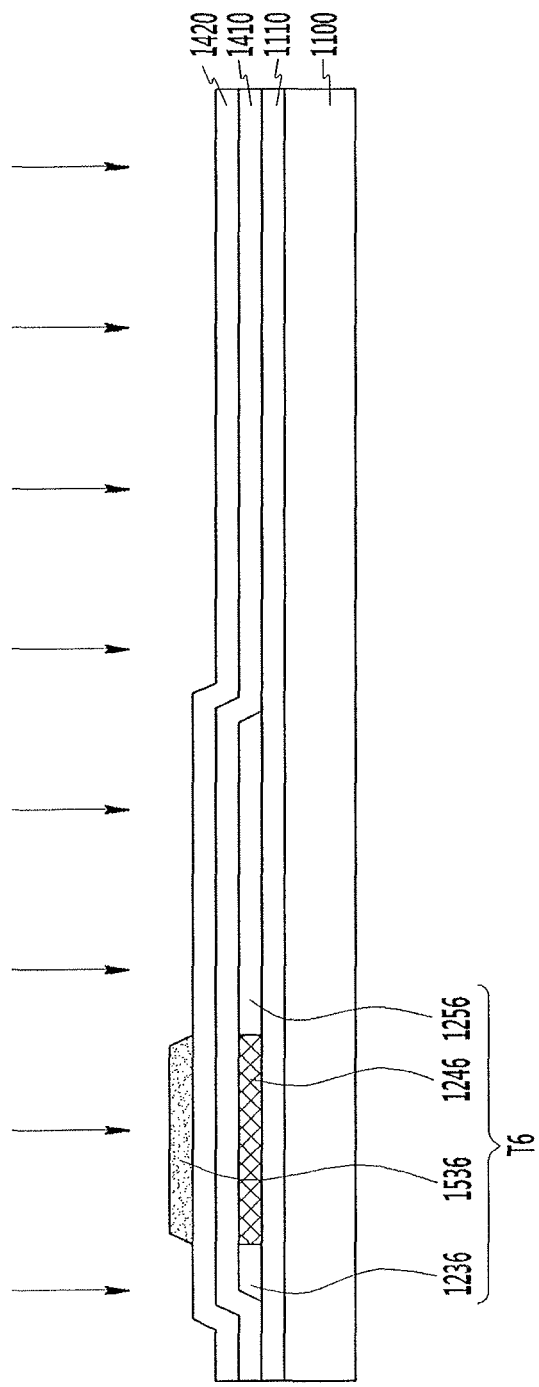
Figure 28:
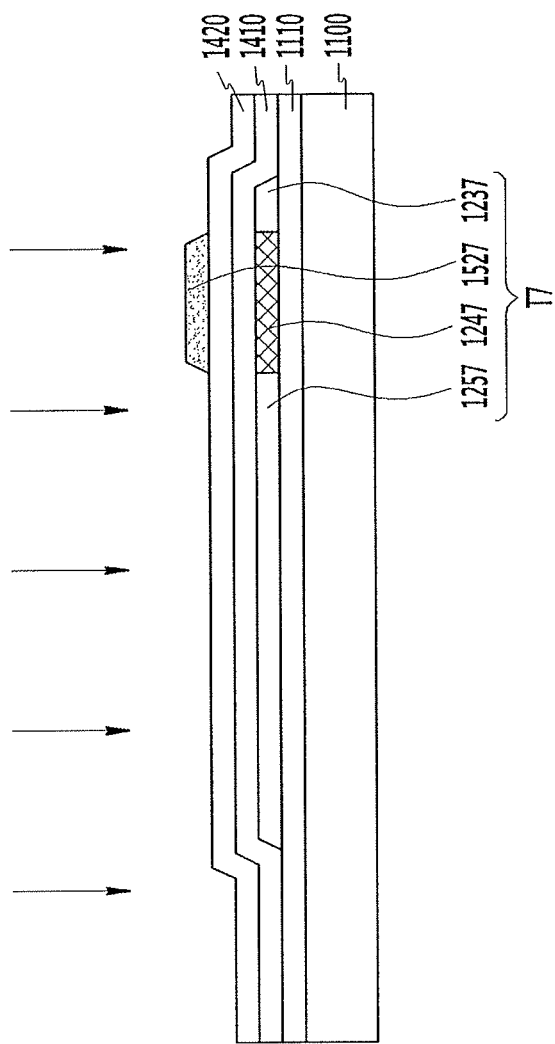
Figure 29:
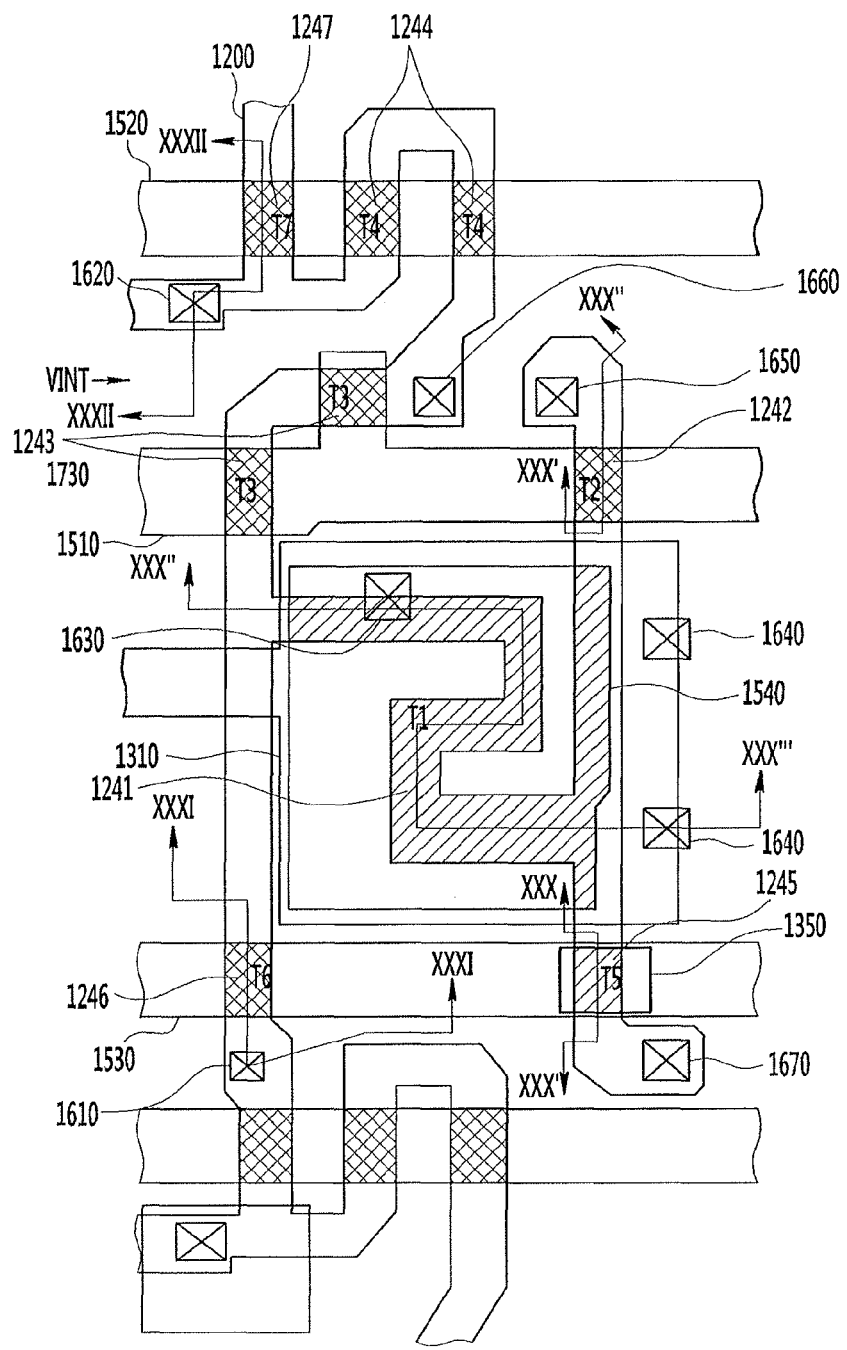
FIG. 29 illustrates a layout of the pixel after the operations in FIGS. 25 to 28.
Figure 30:
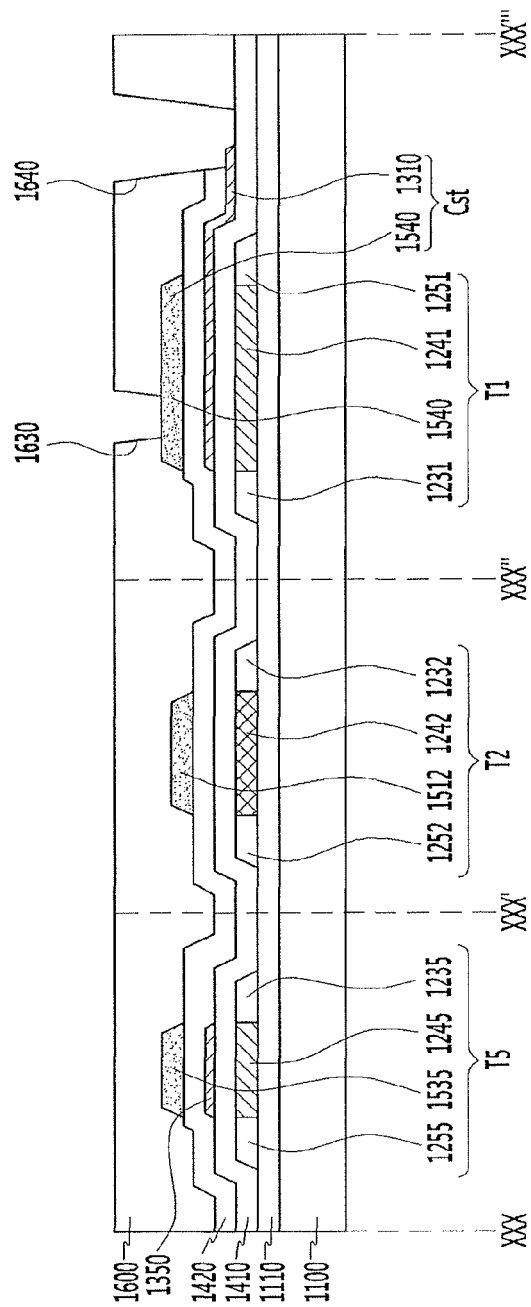
FIGS. 30 to 32 illustrate the OLED display along section lines XXX-XXX'-XXX''-XXX''', XXXI-XXI, and XXXII-XXXII.
Figure 31:
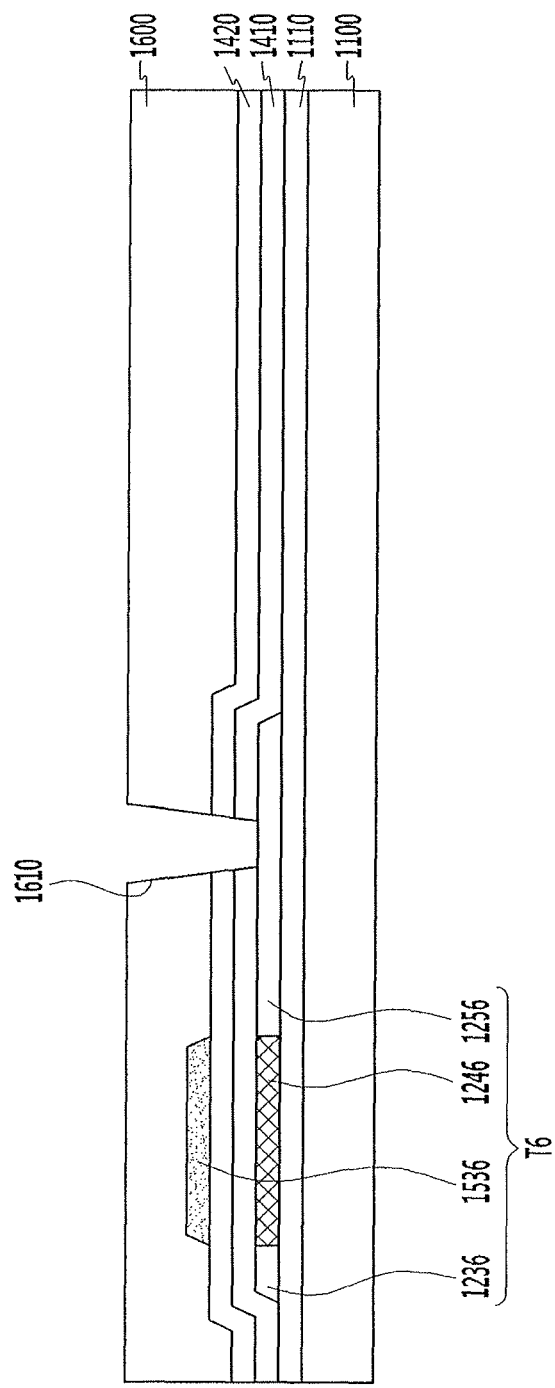
Figure 32:
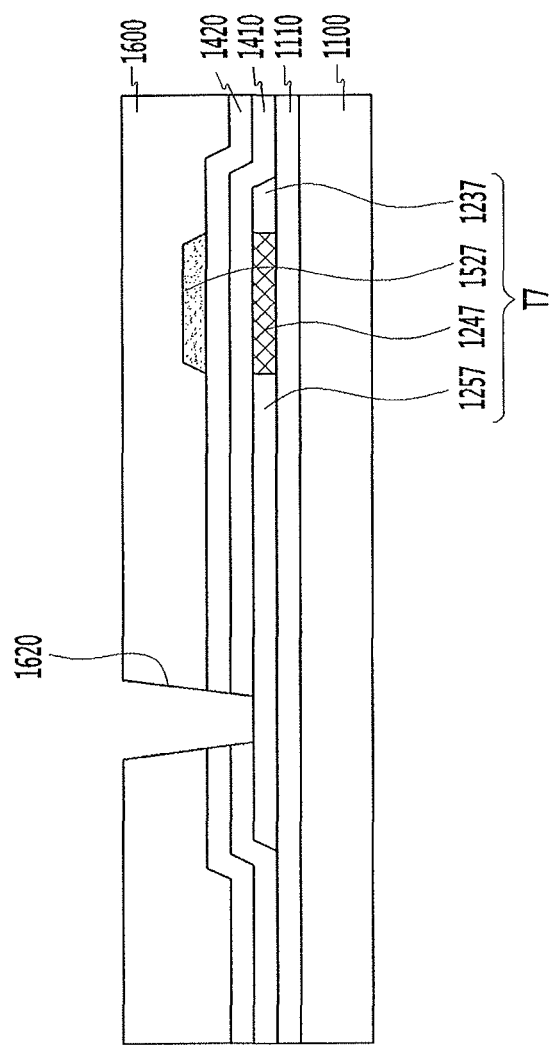
Figure 33:
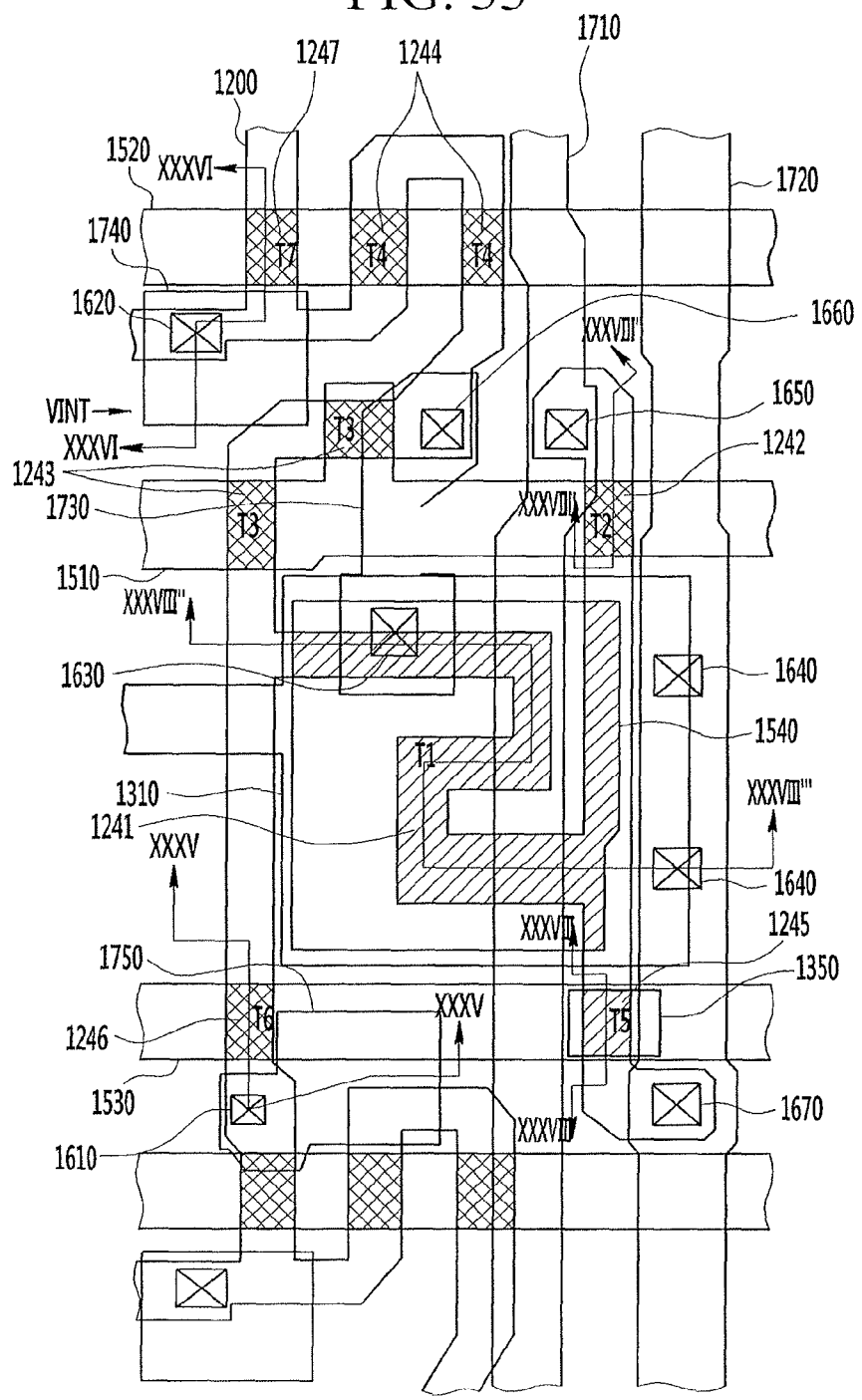
FIG. 33 illustrates a layout the pixel after the operations in FIGS. 29 to 32.
Figure 34:
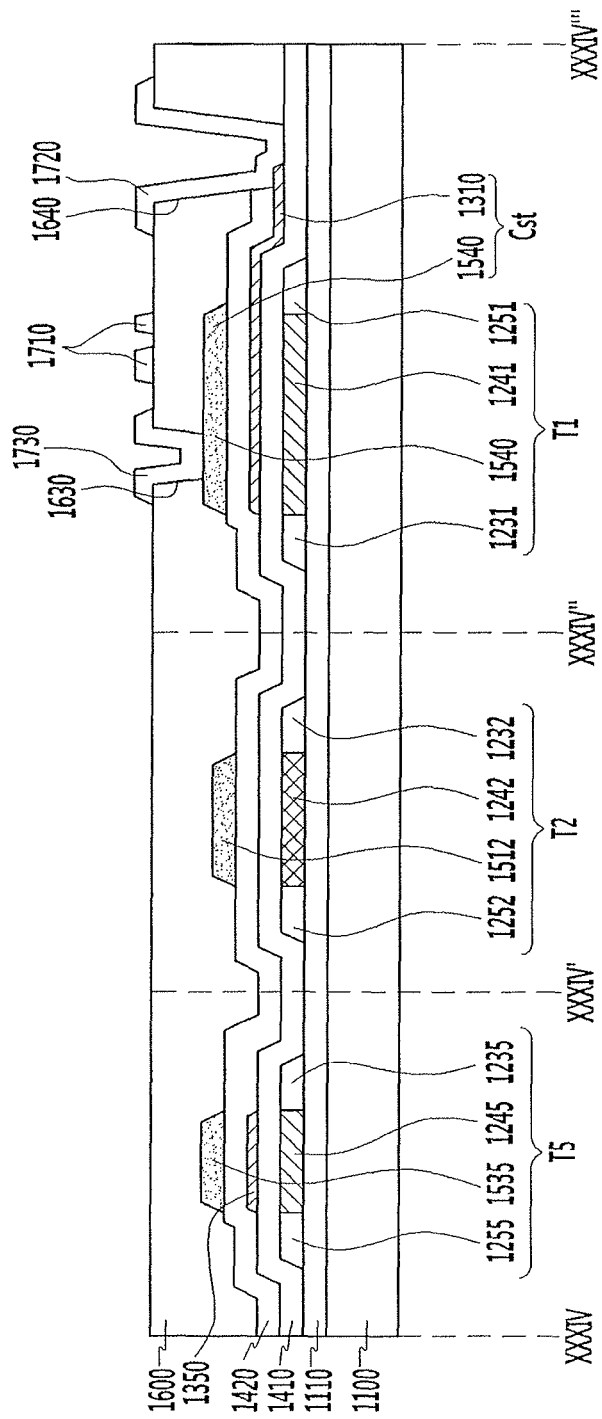
FIGS. 34 to 36 illustrate the OLED displaying FIG. 33 along section lines III-III'-III''-III''', XXXV-XXXV, and XXXVI-XXXVI.
Figure 35:
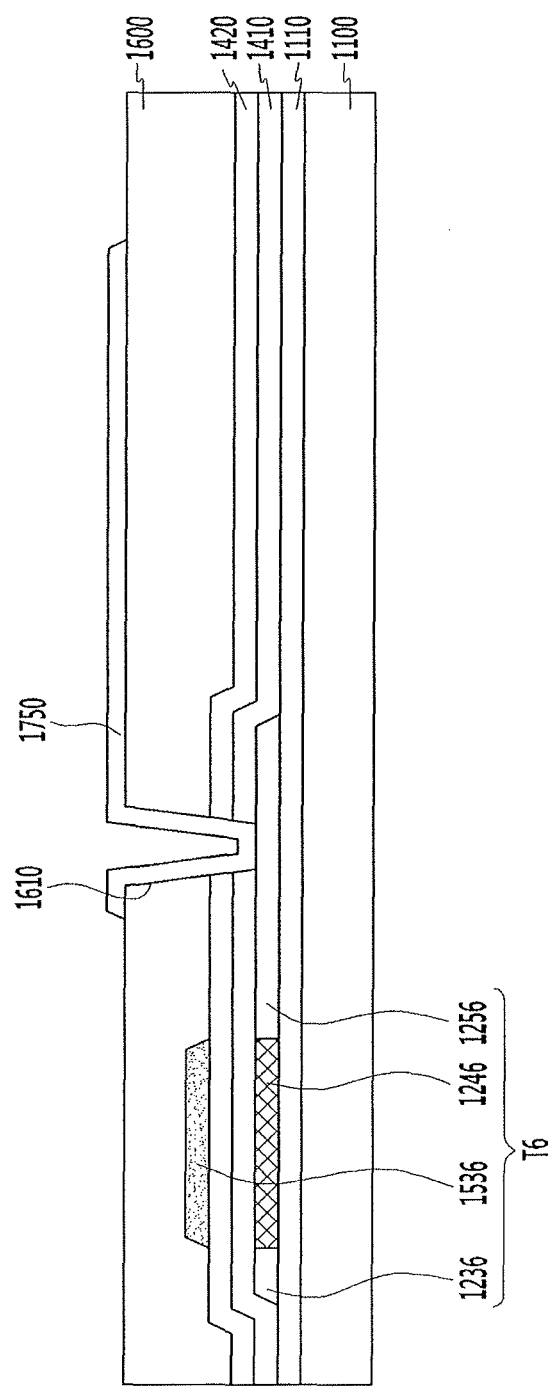
Figure 36:
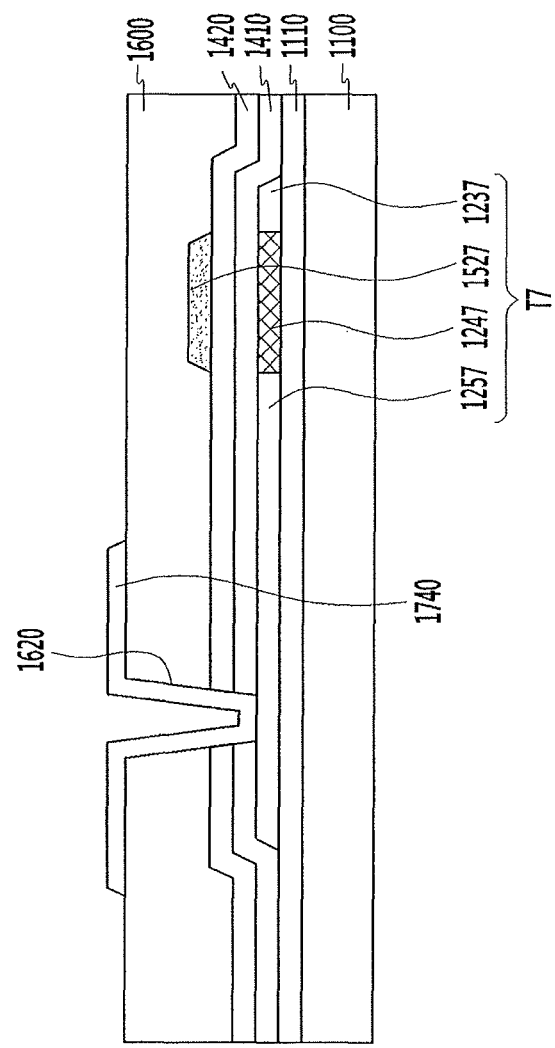
Figure 37:
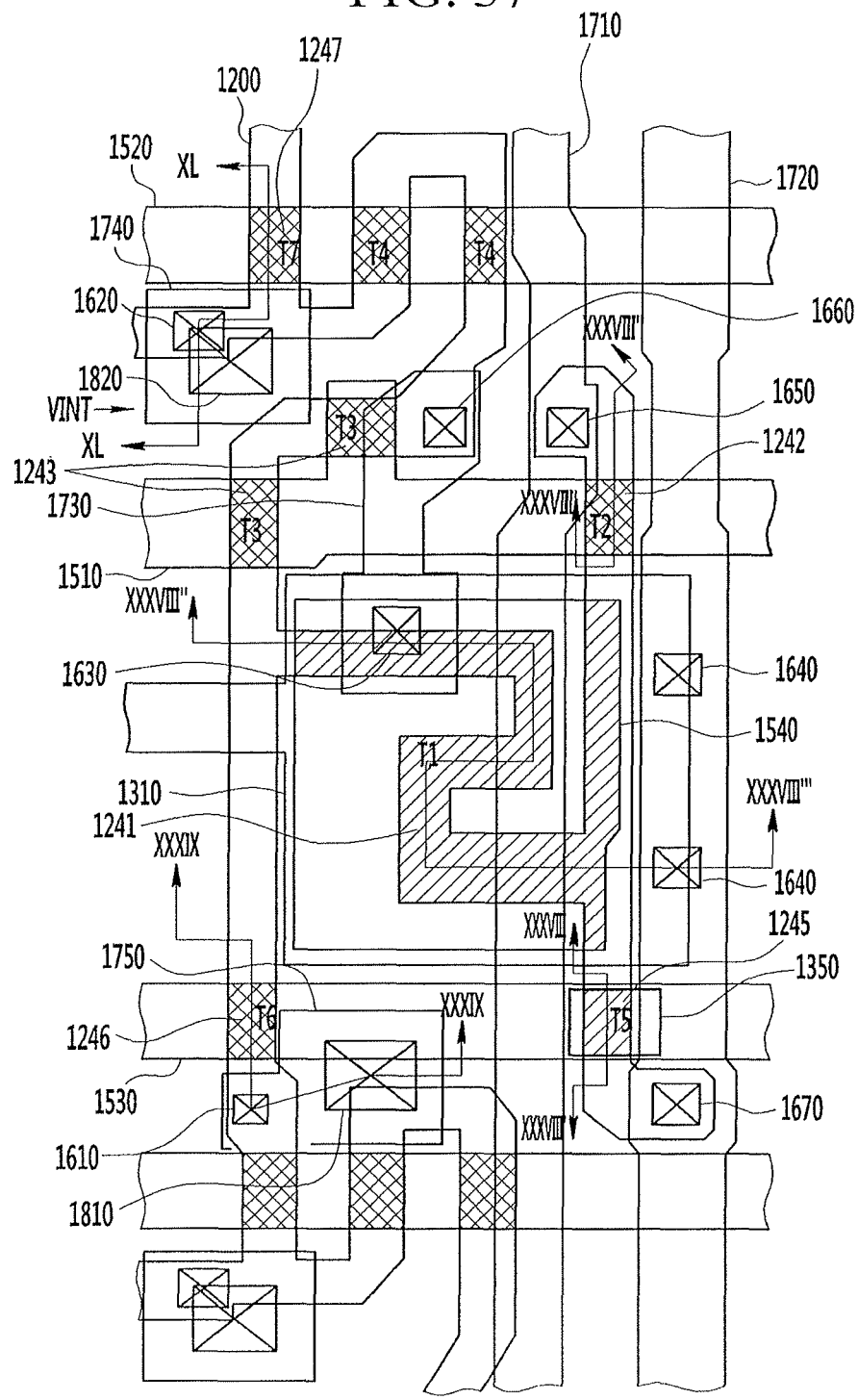
FIG. 37 illustrates the pixel after the operations in FIGS. 33 to 36.
Figure 38:
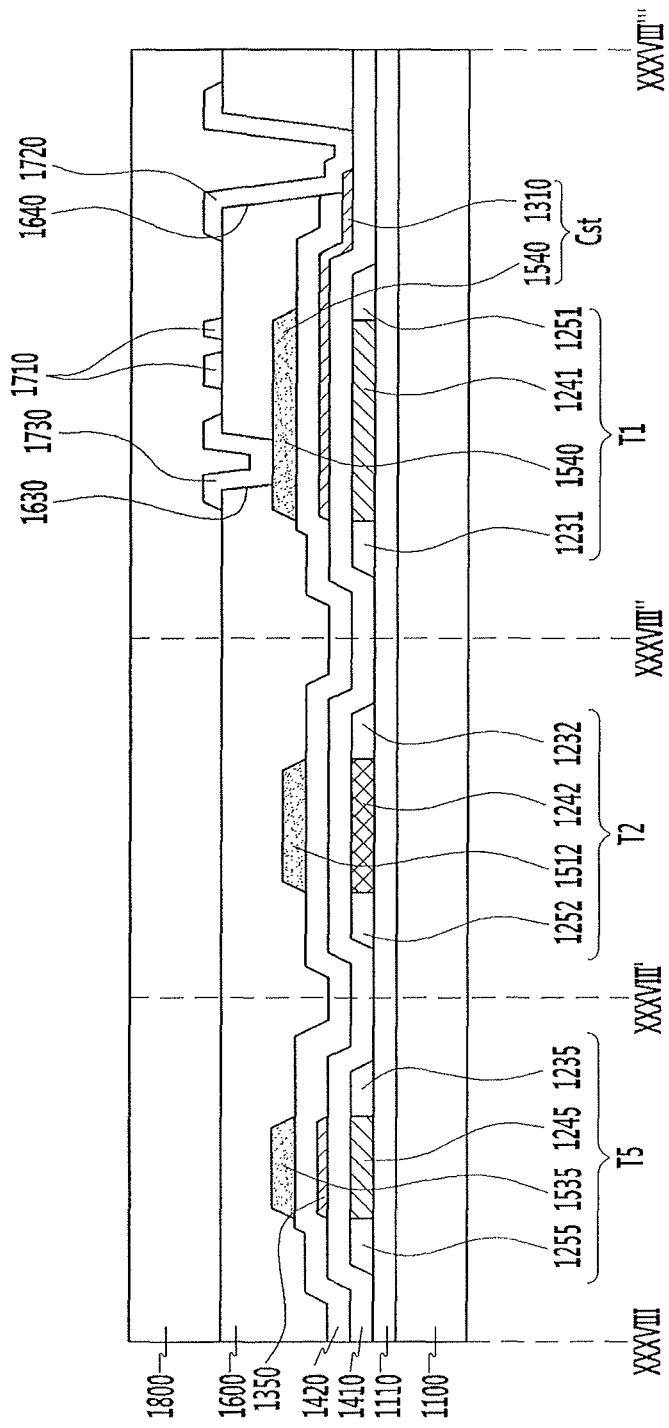
FIGS. 38 to 40 illustrate the OLED display in FIG. 37 along section lines XXXIX-XXXIX, and XL-XL.
Figure 39:
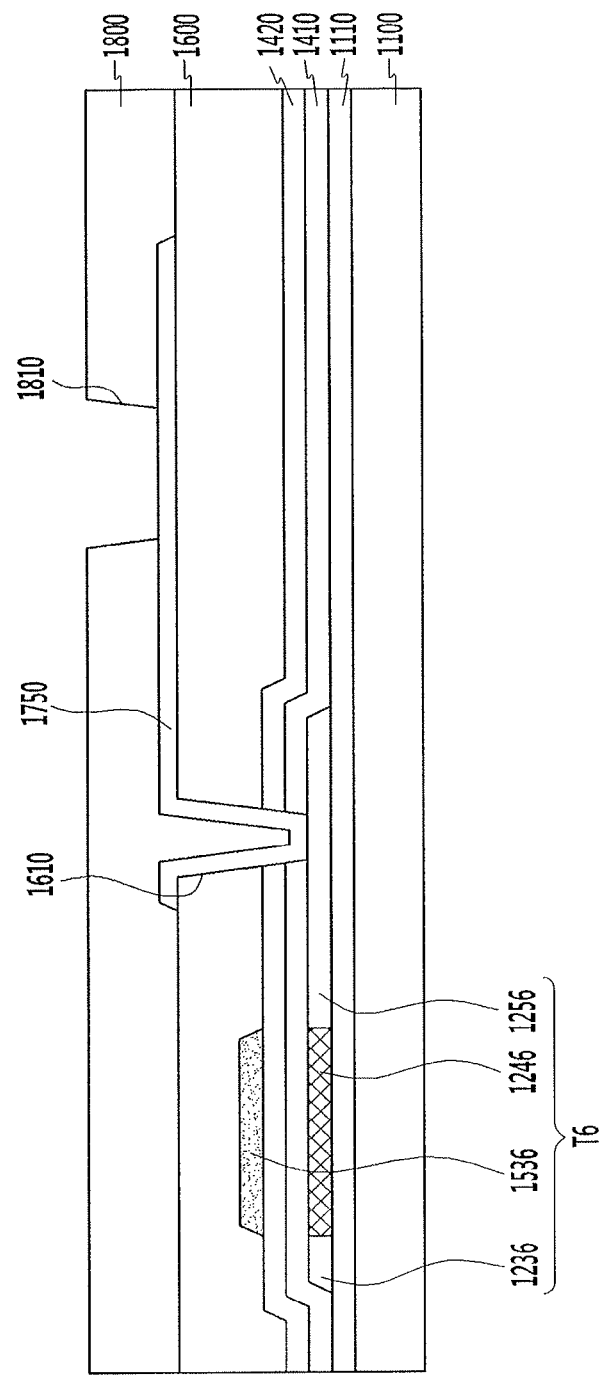
Figure 40:
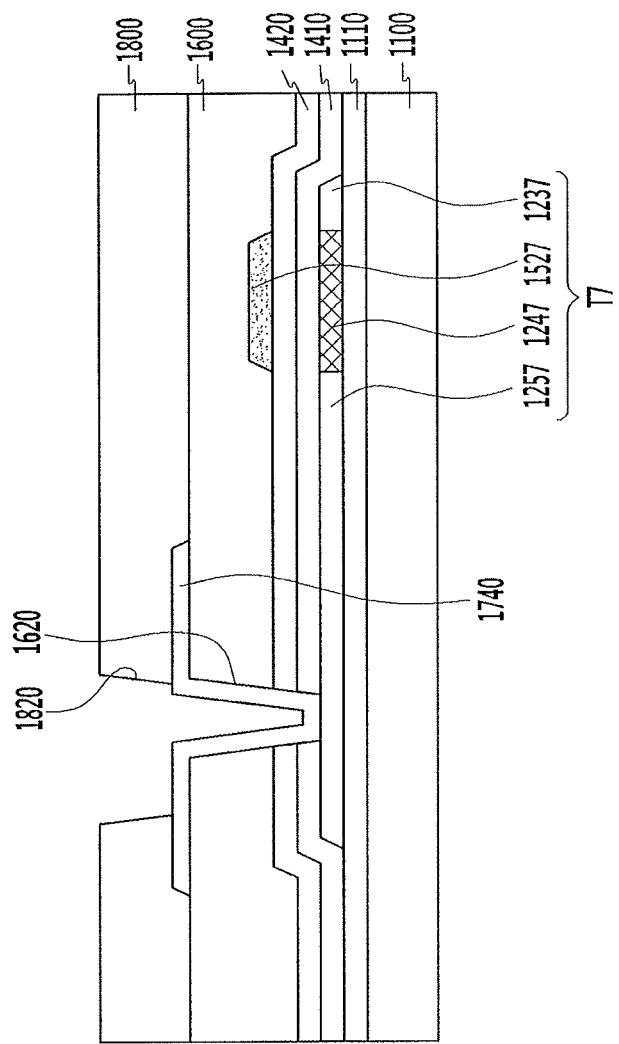

FIGS. 6 to 40 illustrate an embodiment of a method for manufacturing an OLED display. Referring to FIGS. 6 to 8, a buffer layer 1110 is formed on an entire surface of an insulation substrate 1100 that is formed of glass, quartz, ceramic, plastic, etc.

The buffer layer 1110 may be formed as a single layer of a silicon nitride or as a multilayer of a silicon nitride and a silicon oxide, and may be deposited on the entire surface of the insulation substrate 1100 using a methods such as plasma enhanced chemical vapor deposition (PECVD) or the like. Formation of the buffer layer 1110 may be omitted in another embodiment.

Referring to FIGS. 9 to 12, a semiconductor layer is formed on the buffer layer 1110, and is then patterned to form a semiconductor pattern layer 1210. The semiconductor layer may be formed of polysilicon or an oxide semiconductor. The polysilicon of the semiconductor layer may be formed using a method in which an amorphous silicon layer is laminated and is then crystalized. A deposition method such as PECVD or low pressure chemical vapor deposition (LPCVD) may be used to laminate the amorphous silicon layer.

Various disclosed methods may be applicable as a crystalizing method. For example, the amorphous silicon layer may be crystalized using one selected from a group of solid phase crystallization (SPC), sequential lateral solidification (SLS), excimer laser annealing (ELA), metal induced crystallization (MIC), and metal induced lateral crystallization (MILC) methods.

The semiconductor layer may be patterned using a method such as a photolithography process and the like. A shape of the semiconductor pattern layer 1210 is substantially the same as that of the semiconductor pattern 1200 of the OLED display.

Referring to FIGS. 13 to 16, a first gate insulating layer 1410 is formed on the semiconductor pattern layer 1210. The first gate insulating layer 1410 may be formed by laminating a silicon nitride ($SiN_x$) or silicon oxide ($SiO_x$), and may be formed on the entire surface of the buffer layer 1110 and the semiconductor pattern layer 1210 using PECVD or the like.

Next, a first gate conductive layer including gate patterns 1310 and 1350 is formed on the first gate insulating layer 1410. The first gate conductive layer may be formed by laminating a metal such as copper (Cu), a copper alloy, aluminum (Al), an aluminum alloy, etc., and then patterning it using a photolithography process.

Referring to FIGS. 17 to 20, impurities, for example, a predetermined dose amount of ions such as boron (B) or phosphorus (P), are injected into the entire surface of the insulation substrate 1100 on which the first gate conductive layer is formed, thereby channel-doping the semiconductor pattern layer 1210. In this case, regions of the semiconductor pattern layer 1210 that do not overlap the gate patterns 1310 and 1350 are doped at a higher concentration than regions of the semiconductor pattern layer 1210 that do overlap the gate patterns 1310 and 1350, thereby becoming a doping region 1220.

The semiconductor pattern layer 1210 overlapping the gate patterns 1310 and 1350 is covered by the gate patterns 1310 and 1350 but receives a certain amount of impurities such that it is lightly doped at a lower concentration than the doping region 1220, thereby forming the channel region 1241 of the driving transistor T1 and the channel region 1245 of the operation control transistor T5, respectively.

As such, doping concentrations of different regions are differently adjusted to allow selective doping such that asymmetry of the threshold voltages between the transistors may be achieved. In this case, thicknesses of the gate patterns 1310 and 1350 may be appropriately controlled such that the channel regions 1241 and 1245 of desired doping concentrations are formed. In addition, an overall doping concentration may be controlled to adjust characteristics such as the threshold voltages of the thin film transistors, the source-drain currents, etc.

Referring to FIGS. 21 to 24, an insulating material is laminated on the first gate insulating layer 1410 and the gate patterns 1310 and 1350 to form a second gate insulating layer 1420.

Next, a metal and the like are laminated on the second gate insulating layer 1420 and are then patterned to form a second gate conductive layer including a gate line 1510, a previous gate line 1520, a light emission control line 1530, and a driving gate electrode 1540. The second gate conductive layer may be formed as a single layer of copper (Cu), a copper alloy, aluminum (Al), an aluminum alloy, or as a multilayer of a metal layer including any one of them and a metal layer including either one of molybdenum (Mo) and a molybdenum alloy.

The gate line 1510 includes a switching gate electrode 1512 and a compensation gate electrode, the previous gate line 1520 includes an initialization gate electrode and a bypass gate electrode 1527, and the light emission control line 1530 includes an operation control gate electrode 1535 and an emission control gate electrode 1536.

Referring to FIGS. 25 to 28, a predetermined amount of impurity ions are doped using the second gate conductive layer as a doping mask to form drain electrodes 1251, 1252, 1255, 1256, and 1257 and source electrodes 1231, 1232, 1235, 1236, and 1237 of the respective transistors T1 to T7 and channel regions 1241, 1242, 1245, 1246, and 1247 therebetween.

A p-type impurity or n-type impurity may be used as the conductive type of impurity ions. The p-type impurity may be selected from a group of boron (B), aluminum (Al), gallium (Ga), and indium (In), and the n-type impurity may be selected from a group of phosphorus (P), arsenic (As), antimony (Sb), and the like.

Referring FIGS. 29 to 32, an organic insulating material or inorganic insulating material is laminated on entire surfaces of the second gate insulating layer 1420 and the second gate conductive layer to form an interlayer insulating layer 1600.

Next, the interlayer insulating layer 1600 and the first and second gate insulating layers 1410 and 1420 thereunder are patterned to form a contact hole 1630 that exposes the driving gate electrode 1540, a contact hole 1640 that exposes the gate pattern 1310, a contact hole 1610 that exposes the light emission control drain electrode 1256, a contact hole 1620 that exposes the bypass drain electrode 1257, a contact hole 1650 that exposes the switching source electrode 1232, a contact hole 1660 that exposes the initialization drain electrode, and a contact hole 1670 that exposes the operation control source electrode 1235.

Referring to FIGS. 33 to 36, a conductive layer of a metal and the like is formed on the interlayer insulating layer 1600 and is then patterned to form a data conductive layer including a data line 1710, a driving voltage line 1720, a first connecting member 1730, a second connecting member 1740, and a third connecting member 1750.

The data conductive layer may be formed as a single layer of copper, a copper alloy, aluminum, or an aluminum alloy, or as a multilayer including a metal layer including any one of them and a metal layer including either one of molybdenum and a molybdenum alloy. For example, the data conductive layer may be formed as a triple layer of Mo/Al/Mo or Mo/Cu/Mo.

Referring to FIGS. 37 to 40, an organic insulating material or inorganic insulating material is laminated on the data conductive layer to form a passivation layer 1800. When the passivation layer 1800 includes the organic insulating material, an acryl-based resin, a polyimide-based resin, or benzocyclobutene (BCB) may be used.

Next, the passivation layer 1800 is patterned to form a via hole 1810 exposing the third connecting member 1750 and a via hole 1820 exposing the second connecting member 1740.

As shown in FIGS. 2 to 5, a transparent conductive material or metal such as ITO, IZO, or the like is laminated on the passivation layer 1800 and is then patterned to form a pixel electrode 191 and an initialization voltage line 192.

Next, an organic material or inorganic material is laminated thereon and is then patterned to form a pixel definition layer 3500 including an opening 3505. When formed of the organic material, the pixel definition layer 3500 may be formed of one selected from a group of benzocyclobutene (BCB), an acryl-based polymer, and a polyimide.

The pixel definition layer 3500 may substantially have a smooth surface. In addition, the pixel definition layer 3500 may be formed such that it has a sufficient thickness to fill the via holes 1810 and 1820.

Next, a light emission layer 370 and an opposed electrode 270 are sequentially formed on the pixel electrode 191 in opening 3505 of pixel definition layer 3500. The opposed electrode 270 may be formed by laminating a transparent conductive material, and for example, may be formed of a material including Mg, Ag, Al, Ca, and an alloy thereof with a low work function. An encapsulation member for protecting the OLED may be further formed on the opposed electrode 270.

Figure 41:
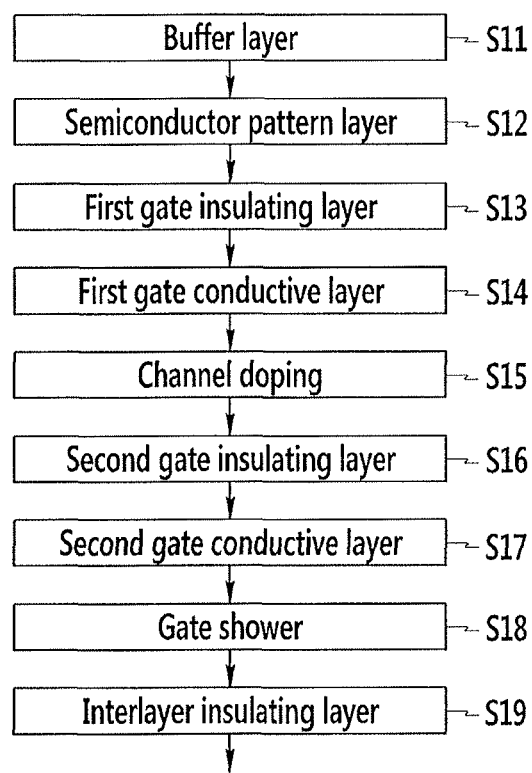
FIGS. 41 and 42 illustrate operations in embodiments for manufacturing an OLED display.

FIG. 41 illustrates an embodiment of a method for manufacturing an OLED display. For example, the buffer layer is formed on the insulation substrate (S11), the semiconductor pattern layer is formed thereon (S12), the first gate insulating layer is formed thereon (S13), the first gate conductive layer is formed thereon (S14), channel doping is performed by doping the impurities (S15), the second gate insulating layer is formed thereon (S16), the second gate conductive layer is formed thereon (S17), a gate shower for injecting the impurity ions is performed using the second gate conductive layer as the doping mask (S18), and the interlayer insulating layer is formed thereon (S19).

Figure 42:
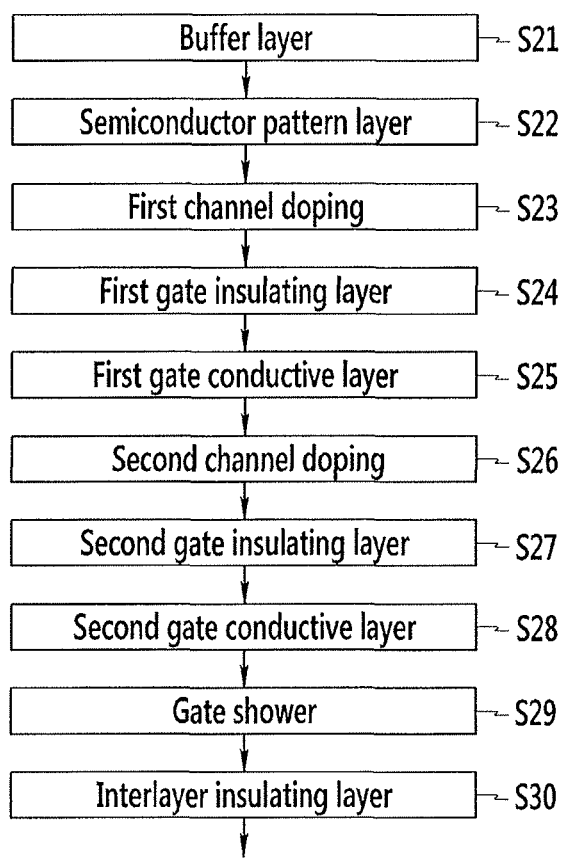

FIG. 42 illustrates an embodiment of a method for manufacturing an OLED display that is different from the method in FIGS. 6 to 40 and FIG. 41. Referring to FIG. 42, the buffer layer is formed on the insulation substrate (S21), the semiconductor pattern layer is formed thereon (S22), and then the impurities are injected to perform first channel doping on the entire semiconductor pattern layer 1210 (S23).

Then, the first gate insulating layer is formed (S24), the first gate conductive layer is formed thereon (S25), and then the impurities are doped to perform second channel doping (S26). In this case, the second channel doping corresponds to the channel doping (S15) that is illustrated in FIG. 41.

Then, the second gate insulating layer is formed (S27), the second gate conductive layer is formed thereon (S28), the gate shower for injecting the conductive type impurity ions is performed using the second gate conductive layer as the doping mask (S29), and the interlayer insulating layer is formed thereon (S30).

According to one embodiment illustrated in FIG. 42, since the first channel doping is performed immediately after forming the semiconductor pattern layer 1210 and the second channel doping is performed after forming the first gate conductive layer, the threshold voltages of the transistors may be more minutely adjusted to more easily reach target threshold voltages.

As described above, according to at least one embodiment, degrees of the channel doping are selectively controlled to make the threshold voltages of the transistors different from one another even without an additional mask, thereby differently controlling the turn-on time and turn-off time. Also, a turn-off time gap between the operation control transistor T5 and the light emission control transistor T6 is generated to apply the driving voltage ELVDD to the driving source electrode S1 of the driving transistor T1 in the source initialization period P1 of the driving transistor T1, thereby initializing hysteresis of the driving transistor T1. Accordingly, a display abnormality such as the motion blur of the OLED display may be prevented to implement the motion clarity, thereby improving display quality.

Figure 43:
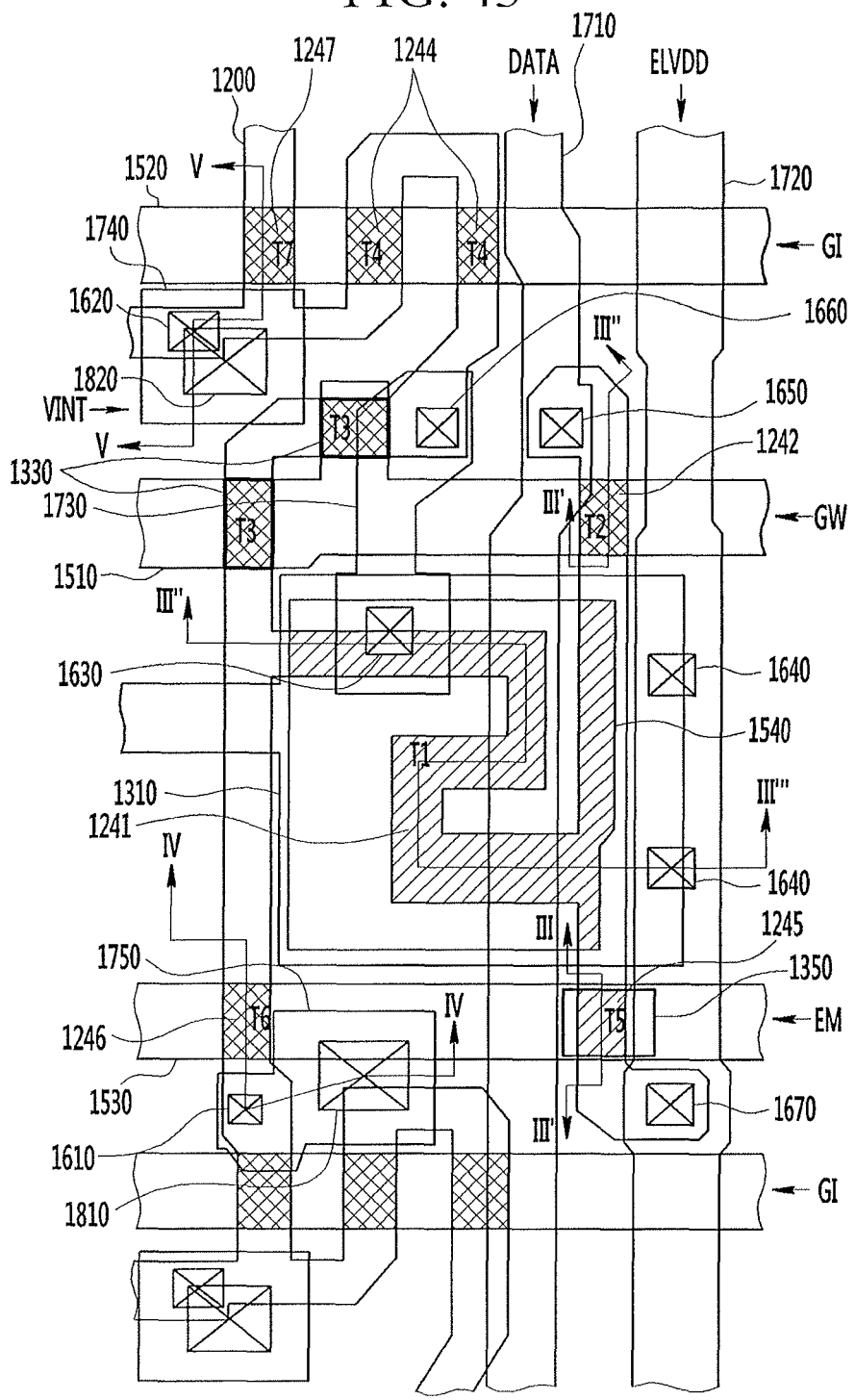
FIG. 43 illustrates a layout a pixel of an OLED display.

FIG. 43 illustrates a layout another embodiment of an OLED display pixel which is almost the same as the OLED display described above. However, as another example in which doping concentrations of channels are made different, the channel region 1243 of the compensation transistor T3 is also channel-doped at the same concentration as that of the channel region 1245 of the operation control transistor T5. As such, a turn-off characteristic of the compensation transistor T3 may be enhanced to improve bright spot failures due to a leakage current. For this purpose, at least one gate pattern 1330 may be formed on the first gate insulating layer 1410 in the same layer as the gate patterns 1310 and 1350. Functionality of the gate pattern 1330 in the manufacturing process is almost the same as those of the gate patterns 1310 and 1350.

By way of summation and review, transistors in a pixel driving circuit of an OLED display have their threshold voltages independently adjusted according to their functions. In one embodiment, an output characteristic of a driving transistor varies when a voltage is applied for changing the intensity of instantaneously emitted light. Thus, even if the same driving transistor is used, the characteristics of the driving transistor may vary according to a changing direction of image brightness, e.g., a bias direction. As a result, when the OLED display displays a video, unwanted luminance may be displayed to cause almost the same effect as motion blur.

In accordance with one embodiment, in order to remove such motion blur, threshold voltages of some transistors of the pixel driving circuit need to be differently adjusted compared with those of the other transistors. In one embodiment, an OLED display, and a manufacturing method thereof, adjusting the threshold voltages of two thin film transistors differently without decreasing capacitance of the pixel driving circuit. Additionally, a driving method for an OLED display ensures motion clarity by differently adjusting threshold voltages of two thin film transistors to remove motion blur.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting diode display, comprising:
    a driving transistor including a driving gate electrode coupled to a storage capacitor;
    a first switching transistor including a first source electrode coupled to a driving drain electrode of the driving transistor; and
    a second switching transistor including a second drain electrode coupled to a driving source electrode of the driving transistor, wherein a second source electrode of the second switching transistor receives a driving voltage, and wherein a channel region of the first switching transistor and a channel region of the second switching transistor have different doping concentrations.

2. The display as claimed in claim 1, wherein the doping concentrations of the channel region of the first switching transistor and a channel region of the driving transistor are substantially equal.

3. The display as claimed in claim 2, further comprising:
    a first gate conductive layer including a portion between a gate electrode of the first switching transistor and the channel region of the first switching transistor.

4. The display as claimed in claim 3, wherein the first gate conductive layer includes a portion between the driving gate electrode of the driving transistor and the channel region of the driving transistor.

* * * * *